United States Patent [19]
Yamaguchi

[11] Patent Number: 5,942,926
[45] Date of Patent: *Aug. 24, 1999

[54] PLL CIRCUIT

[75] Inventor: Atsuo Yamaguchi, Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/721,959

[22] Filed: Sep. 27, 1996

[30] Foreign Application Priority Data

Apr. 5, 1996 [JP] Japan .................................. 8-083802

[51] Int. Cl.[6] ........................... H03L 7/089; H03L 7/099
[52] U.S. Cl. ......................... 327/156; 327/158; 327/12; 327/7; 331/17; 331/34
[58] Field of Search ..................................... 327/142, 143, 327/144, 145–147, 3, 7, 8, 12, 155–158, 41, 162, 163; 331/17, 11, 1 A, 34

[56] References Cited

U.S. PATENT DOCUMENTS

| | | | |
|---|---|---|---|
| 4,451,794 | 5/1984 | Yamada | 327/8 |
| 4,803,705 | 2/1989 | Gillingham et al. | 331/17 |
| 4,837,643 | 6/1989 | Tierney, III | 327/147 |
| 5,072,195 | 12/1991 | Graham et al. | 331/11 |
| 5,144,156 | 9/1992 | Kawasaki | 331/17 |
| 5,220,294 | 6/1993 | Ichikawa | 331/1 A |
| 5,297,173 | 3/1994 | Hikmet et al. | 331/11 |
| 5,315,186 | 5/1994 | Baker | 327/41 |
| 5,332,930 | 7/1994 | Volk | 327/156 |
| 5,371,425 | 12/1994 | Rogers | 327/3 |
| 5,463,353 | 10/1995 | Countryman et al. | 331/57 |
| 5,475,326 | 12/1995 | Masuda | 327/148 |
| 5,508,660 | 4/1996 | Gersbach et al. | 327/157 |
| 5,563,553 | 10/1996 | Jackson | 327/157 |
| 5,661,419 | 8/1997 | Bhagwan | 327/157 |

OTHER PUBLICATIONS

Toshihiko Moro, "Transistor Art", pp. 270–271, vol. 31, No. 356, May 1994 (in Japanese, accompanied with English translation).

*Primary Examiner*—Timothy P. Callahan
*Assistant Examiner*—Eunja Shin

[57] ABSTRACT

A PLL circuit is disclosed which can achieve a locked state in a short time. The PLL circuit has a phase comparator, a loop filter and a voltage controlled oscillator. The phase comparator is provided with frequency adjusting (or matching) circuits that are operative to charge the loop filter when it is detected that an oscillation frequency of the voltage controlled oscillator is lower than a frequency of an input signal, so as to increase the oscillation frequency of the voltage controlled oscillator, until it is detected that an oscillation frequency of the voltage controlled oscillator is higher than the frequency of the input signal. Similarly, the loop filter is discharged when it is detected that an oscillation frequency of the voltage controlled oscillator is higher than a frequency of an input signal, so as to decrease the oscillation frequency of the voltage controlled oscillator, until it is detected that an oscillation frequency of the voltage controlled oscillator is lower than the frequency of the input signal. The phase comparator is further provided with phase adjusting (or matching) circuits for adjusting a phase of an output of the voltage controlled oscillator to a phase of the input signal after the oscillator frequency of the voltage controlled oscillator is adjusted to the frequency of the input signal. Thus, a time required to adjust the oscillation frequency of the voltage controlled oscillator can be considerably reduced.

13 Claims, 17 Drawing Sheets

5,942,926

PLL CIRCUIT

BACKGROUND OF THE INVENTION

1. Field of the Invention

This invention generally relates to a PLL (Phase-Locked Loop) circuit and more particularly to a PLL circuit which employs a carrier signal modulated by PSK (Phase Shift Keying) as an input signal and which obtains a stable oscillation output signal.

2. Description of the Related Art

There has been a PLL circuit of such a type used in a detection circuit when a reception is performed in a non-contact integrated-circuit (IC) card for performing communication by carrying out a PSK modulation, which is described in the Japanese Patent Application No. 7-244738 (not published). FIG. 15 schematically illustrates the configuration of a receiving circuit, which contains a PLL circuit, of this non-contact IC card. Incidentally, in FIG. 15, a circuit for performing a modulation at the time of transmitting is omitted.

In FIG. 15, reference character 1 designates a non-contact IC card; 2 an antenna resonance circuit which is a parallel resonance circuit including an antenna coil 2a and a capacitor 2b; 3 a full-wave bridge rectifying circuit including of rectifying devices 3a to 3d; 4 a switching circuit including N-channel transistors 4a to 4d; 5 an inverter; 6 a Zener diode for obtaining a constant power supply voltage; 7 an energy storage circuit for smoothing a rectified voltage and for storing energy; and Ra a resistor.

Further, reference numeral 8 denotes a comparator; and 9 a D-type flip-flop. These elements compose a circuit for generating a switching signal C to be supplied to the switching circuit 3 that is operative to ground a terminal of the antenna resonance circuit 2, which corresponds to a voltage lower than that at the other terminal thereof. Moreover, reference character 10 represents a PLL circuit; 11 an EX-OR (exclusive OR) circuit; and 12a and 12b D-type flip-flops. These elements compose a detection portion for detecting an occurrence of a phase modulation in an input signal. Furthermore, FIG. 16 illustrates the waveforms of signals respectively flowing through portions of the receiving circuit of FIG. 15.

Next, an operation of the receiving circuit will be briefly described hereinbelow. Reference numeral 0 represents a voltage developed across the antenna resonance circuit 2 (in FIG. 16). When the comparator 8 detects that the signal level of the input signal P becomes lower than the ground level indicated by a dashed line (see FIG. 16), the D-type flip-flop 9 reverses a switching signal Q for causing a switching circuit 4 to ground the terminal of the antenna resonance circuit 2, which corresponds to the lower voltage. Thereby, as is seen from a graph showing the waveform of the input signal P, the terminal of the antenna resonance circuit 2, which corresponds to the lower voltage, is grounded. In contrast, a signal representing the higher voltage level is taken out of the other terminal thereof.

The detection portion including the PLL circuit 10, the EX-OR circuit 11, the D-type flip-flops 12a and 12b produces a reference phase signal from a signal R outputted from the comparator 8 and further detects a change in phase by comparing the phase of this reference phase signal with that of a received signal. The PLL circuit 10 receives the signal R, which indicates that the signal level of the input signal P becomes lower than the ground level, and generates an output signal R' tuned thereto. Then, the frequency of the output signal R' of the PLL circuit 10 is divided by 2 by means of the D-type flip-flop 12b. Further, a resultant signal is employed as a reference phase signal R". Subsequently, an EX-OR 11 carries out an EX-OR between this reference phase signal R" and the switching signal Q. Thereafter, a detection output signal S' is obtained by the D-type flip-flop 12a (for removing so-called "beards" from the signal S) by performing a sampling on the signal S every half of the period of the output signal R' of the PLL circuit 10.

The switching signal Q corresponds to the phase of a received signal. Thereby, an EX-OR between the switching signal Q and the reference phase signal R" is performed. Thus, it is detected whether or not a change in phase of a signal received by performing the sampling every half of the period of the signal.

Namely, the PLL circuit 10 outputs a signal, whose frequency corresponds to the input signal, in such a manner that even when, for example, one of input pulses is omitted similarly as in the case illustrated by the waveform diagrams showing the waveforms of the signals R and R' of FIG. 16, the circuit compensates for the omitted input pulse.

FIG. 17 shows the configuration of an example of the conventional PLL circuit. In FIG. 17 showing the configuration of the PLL circuit 10, reference numeral 20 designates a phase comparator including, for example, NAND-gates 202 to 216; 30 a loop filter including resistors R1 and R2 and a capacitor C1; and 40 a Voltage Controlled Oscillator (hereunder abbreviated as a VCO). Incidentally, this circuit is implemented by a chip, the device No. of which is 74HC4046A.

Thus, the PLL circuit 10 is composed of the phase comparator 20, the loop filter 30 and the VCO 40. The phase comparator 20 generates a voltage according to a difference in phase between the input signal (for instance, the signal R) and the output signal (for example, the signal R') of the VCO 40.

To put this in a little more detail, for instance, in the case that the input signal has a same frequency and a same phase as the output signal of the VCO 40, the duty ratio of pulses of an output signal of the phase comparator 20 is 50%. Further, this duty ratio varies from 50%, which is the center of variation, with a phase lag or a phase lead of the signal. For example, when the duty ratio exceeds 50%, the loop filter 30 is put into a charging state. Thus, the voltage level of the loop filter 30 rises. In contrast, when the duty ratio becomes equal to or less than 50%, the loop filter 30 is put into a discharging state. Thus, the voltage level of the loop filter 30 falls.

An output voltage of this loop filter 30 is a control voltage for the VCO 40. Further, the VCO 40 outputs a signal having a frequency determined in accordance with an input voltage. Furthermore, a feedback control operation is performed in such a way that the differences in frequency and in phase between the input signal R and the output signal R' of the VCO 40 are eliminated.

In the case of the conventional PLL circuit configured as above described, the frequency and phase of the input signal are adjusted to those of the output signal of the VCO, respectively, by repeatedly performing the charging and discharging of the loop filter. Thus, the conventional PLL circuit has encountered a problem that it takes time to put the PLL circuit into a locked state in which the frequency and the phase of the input signal are matched with those of the output signal of the VCO, respectively.

SUMMARY OF THE INVENTION

The present invention is accomplished to solve the aforementioned problem of the related art.

It is, accordingly, an object of the present invention to provide a PLL circuit which can be put into a locked state in a short time (or quickly).

To achieve the foregoing object, in accordance with a first aspect of the present invention, there is provided a PLL circuit (hereunder sometimes referred to as a first PLL circuit of the present invention) which includes: a phase comparator; a loop filter to be charged and discharged according to an output of this phase comparator; and a voltage controlled oscillator that is adapted to oscillate according to a voltage outputted from this loop filter and is further adapted to feed back an output thereof to the phase comparator. In this PLL circuit, the phase comparator includes: frequency adjuster (or matching) means for charging the loop filter in a case, in which it is detected that an oscillation frequency of the voltage controlled oscillator is lower than a frequency of an input signal, so as to increase the oscillation frequency of the voltage controlled oscillator until it is detected that an oscillation frequency of the voltage controlled oscillator is higher than the frequency of the input signal, and for discharging the loop filter in a case, in which it is detected that an oscillation frequency of the voltage controlled oscillator is higher than a frequency of an input signal, so as to decrease the oscillation frequency of the voltage controlled oscillator until it is detected that an oscillation frequency of the voltage controlled oscillator is lower than the frequency of the input signal; and phase adjusting (or matching) means for adjusting a phase of an output of the voltage controlled oscillator to a phase of the input signal after the oscillator frequency of the voltage controlled oscillator is adjusted to the frequency of the input signal.

Thus, the present invention can have advantages in adjusting the oscillation frequency of the voltage controlled oscillator in a short time, and in providing a PLL circuit which can be put into a locked state, in which the frequency and phase of au output of the voltage controlled oscillator are matched with those of an input signal, in a short time.

In the case of an embodiment (hereunder sometimes referred to as a second PLL circuit of the present invention) of the first PLL circuit of the present invention, the phase comparator further includes a frequency adjustment completion delay for delaying completion of adjustment of the frequency of the voltage controlled oscillator so as to prevent the frequency of the voltage controlled oscillator from being adjusted to an erroneous frequency so that the voltage controlled oscillator is locked to the erroneous frequency.

Thus, this embodiment of the present invention has advantages in preventing the frequency of the voltage controlled oscillator from being adjusted to an erroneous frequency so that the voltage controlled oscillator is locked to the erroneous frequency, and in providing a PLL circuit with higher reliability.

In the case of an embodiment (hereunder sometimes referred to as a third PLL circuit of the present invention) of the first or second PLL circuit of the present invention, the (third) PLL circuit is suitable for use in a detection (or detector) circuit for detecting a phase-modulated received signal. Further, in the case when a signal, which indicates that the received signal has been modulated, is inputted to the frequency adjuster means, and when the reception signal has been modulated, the frequency adjuster means continues to adjust the frequency of the voltage controlled oscillator.

Thus, this embodiment of the present invention has an advantage in providing a PLL circuit with higher reliability.

In the case of an embodiment (hereunder sometimes referred to as a fourth PLL circuit of the present invention) of the first, second or third PLL circuit of the present invention, the phase comparator further includes a signal compensator for suppressing a variation in duty ratio of an output of the phase comparator even when a phase-modulated signal is inputted thereto after the frequency of the voltage controlled oscillator is locked.

Thus, this embodiment of the present invention has an advantage in providing a more stable PLL circuit that is hardly affected by a modulated input signal.

In accordance with a second aspect of the present invention, there is provided another PLL circuit (hereunder sometimes referred to as a fifth PLL circuit of the present invention) which also includes: a phase comparator; a loop filter to be charged and discharged according to an output of this phase comparator; and a voltage controlled oscillator that is adapted to oscillate according to a voltage outputted from this loop filter and is further adapted to feed back an output thereof to the phase comparator. In this PLL circuit, the loop filter includes: a capacitor; and first charging/ discharging means for charging and discharging the capacitor by using an electric current corresponding to an electric current used for determining an oscillation frequency of the voltage controlled oscillator. Moreover, the range of an oscillation frequency of this PLL circuit is wide.

Thus, the circuit constant of a loop filter automatically varies with the frequency of the voltage controlled oscillator. Consequently, the present invention has advantages in implementing a PLL circuit, which includes the loop filter, as an integrated circuit (IC), and in providing a PLL circuit having an oscillation frequency of a wide range.

In the case of an embodiment (hereunder sometimes referred to as a sixth PLL circuit of the present invention) of the fifth PLL circuit of the present invention, the voltage controlled oscillator further includes a compensator for directly feeding back an output of the phase comparator thereto and for determining a duty factor of an electric current, the proportion of which to an electric current used to determine an oscillation frequency of the voltage controlled oscillator according to a fed-back amount thereof is predetermined. Thus, a variation in duty ratio of an output of the phase comparator is suppressed even when a phase-modulated signal is inputted thereto.

Consequently, this embodiment of the present invention has advantages in that the circuit constant of a loop filter automatically changes and in that a PLL circuit, whose state is put into a locked state in a shorter time, can be provided.

In the case of an embodiment (hereunder sometimes referred to as a seventh PLL circuit of the present invention) of the fifth or sixth PLL circuit of the present invention, the phase comparator further includes a: frequency adjuster (or matching) for charging the loop filter in a case, in which it is detected that an oscillation frequency of the voltage controlled oscillator is lower than a frequency of an input signal, so as to increase the oscillation frequency of the voltage controlled oscillator until it is detected that an oscillation frequency of the voltage controlled oscillator is higher than the frequency of the input signal, and for discharging the loop filter in a case, in which it is detected that an oscillation frequency of the voltage controlled oscillator is higher than a frequency of an input signal, so as to decrease the oscillation frequency of the voltage controlled oscillator until it is detected that an oscillation frequency of the voltage controlled oscillator is lower than the frequency of the input signal; and a phase adjuster (or matching) for adjusting a phase of an output of the voltage controlled oscillator to a phase of the input signal after the oscillator frequency of the voltage controlled oscillator is adjusted to the frequency of the input sinal. Moreover, the loop filter further includes second charging/discharging means for charging and discharging the capacitor according to an output of the frequency adjusting (or matching) means. Furthermore, a charging/discharging current in the loop filter is increased only when adjusting the oscillation frequency of the voltage controlled oscillator.

Thus, this embodiment of the present invention has an advantage in that a more accurate PPL circuit, which is affected by neither errors in the charging and discharging currents nor phase shifts due to a time lag in performing the switching between the charging and the discharging of the capacitor, can be provided.

In the case of an embodiment (hereunder sometimes referred to as an eighth PLL circuit of the present invention) of the fifth, sixth or seventh PLL circuit of the present invention, the loop filter includes charging/discharging control for controlling the first charging/discharging means based on both of an output of the phase comparator and an output of the voltage controlled oscillator in such a manner that the first charging/discharging means charges and discharges the capacitor at a duty ratio corresponding to a phase difference between the output of the voltage controlled oscillator and the input signal.

Thus, this embodiment of the present invention has an advantage in that a PLL circuit, whose stability is not deteriorated even when the range of the frequency is expanded, can be provided.

Furthermore, an embodiment (hereunder sometimes referred to as a ninth PLL circuit of the present invention) of the eighth PLL circuit of the present invention is further provided with a frequency divider (or division) circuit for performing a frequency division on an output of the voltage controlled oscillator, which is fed back to the phase comparator. Moreover, the charging/discharging control of the loop filter includes a limiting device for limiting a duty factor of a current used to charge and discharge the capacitor according to a frequency division ratio of the frequency divider circuit.

Thus, this embodiment of the present invention has an advantage in that a PLL circuit, whose stability is not deteriorated even when the range of the frequency is expanded, can be provided.

Additionally, an embodiment (hereunder sometimes referred to as a tenth PLL circuit of the present invention) of the fifth, sixth, seventh, eighth or ninth PLL circuit of the present invention is further provided with a frequency divider (or division) circuit for performing a frequency division on an output of the voltage controlled oscillator, which is fed back to the phase comparator. Moreover, the loop filter further includes charging/discharging current changing means for changing a ratio of a charging/discharging electric current of the first charging/discharging means thereof to an electric current used to determine an oscillation frequency of the voltage controlled oscillator.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which.

DESCRIPTION OF THE PREFERRED EMBODIMENTS

Hereinafter, the PLL circuits embodying the present invention, namely, the preferred embodiments of the present invention will be described in detail by referring to the accompanying drawings.

Embodiment 1

Figure 1:
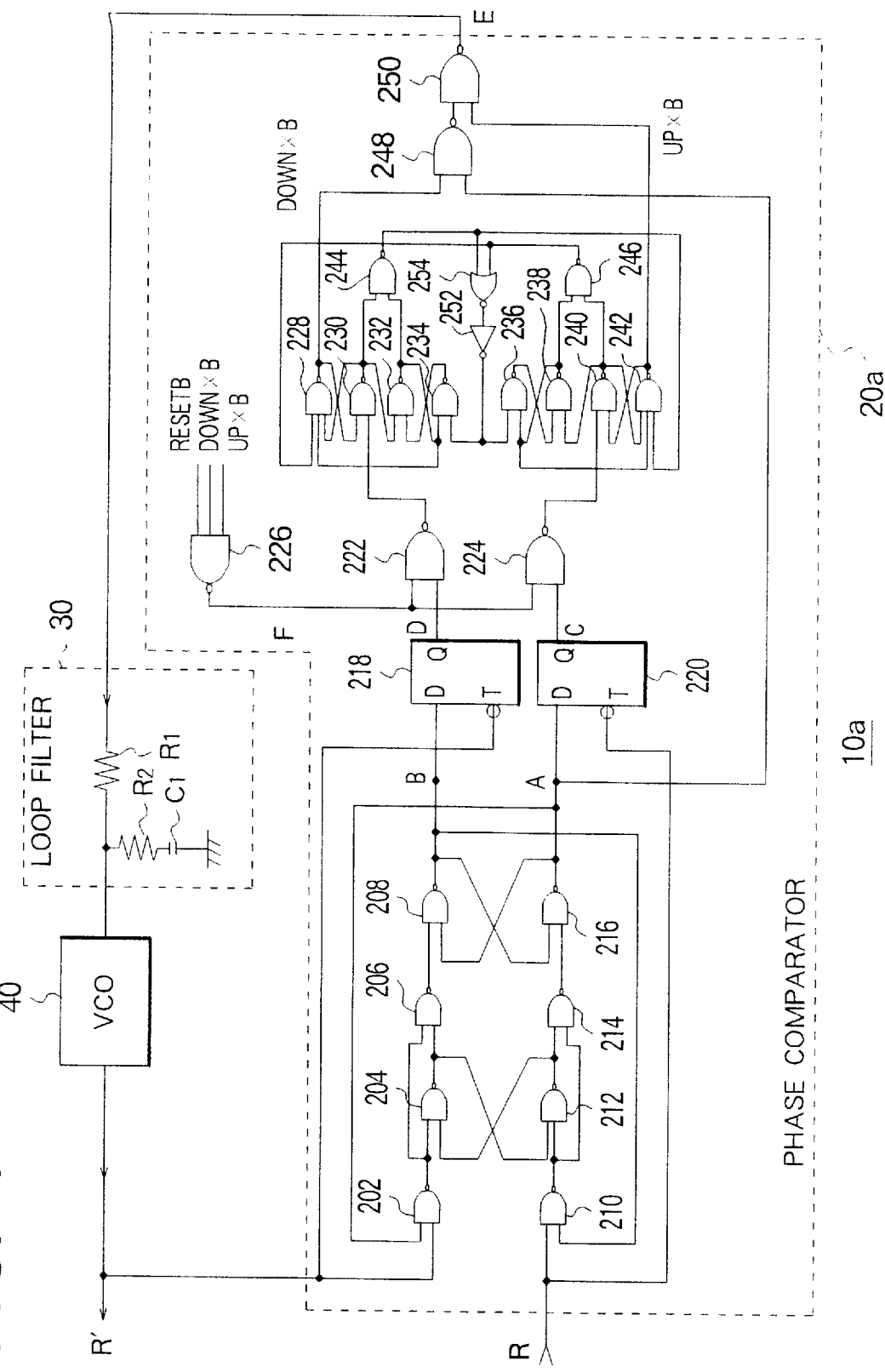
FIG. 1 is a diagram for illustrating the configuration of a PLL embodying the present invention.

FIG. 1 is a diagram for illustrating the configuration of a PLL embodying the present invention, namely, a first embodiment of the present invention. Further, a PLL circuit 10a includes a phase comparator 20a, a loop filter 30 and a VCO 40.

In this figure which shows the phase comparator 20a, reference numerals 202 to 216 and 222 to 250 designate NAND gates; 218 and 220 D-type flip-flops; 252 an inverter; and 254 a NOR gate. Basically, the loop filter 30 and the VCO 40 are the same as of the conventional type. Further, FIG. 2 illustrates the waveform of a signal flowing through each of various parts of the circuit of FIG. 1 during the frequency of an output signal R' of the VCO 40 is increased from a certain frequency, which is lower than the frequency of an input signal R, up to the frequency of the signal R.

In the case of the loop filter 30, a change in frequency of an output thereof corresponds to a change in voltage developed across a capacitor C1. Therefore, an operation of changing the frequency of the output thereof involves the charging/discharging of the capacitor C1 and thus takes time. In contrast, a change in phase of an output thereof corresponds to a change in voltage developed across a resistor R2. The phase of the output thereof, therefore, can be changed quickly.

In the case of the PLL circuit 10a of this embodiment, either of the charging and the discharging of the loop filter 30 is performed until the frequency of the output signal R' becomes equal to the frequency of the input signal R for the first time. After becomes equal thereto, the circuit is caused to operate in such a manner that the phase of the output signal R' is adjusted to the phase of the input signal R by repeating the charging and discharging of the loop filter 30. Thus, when adjusting the frequency of the output signal R', the circuit has only to perform a process of bringing the frequency of the output signal R' close to a predetermined frequency from a frequency, which is lower or higher than the predetermined frequency, without repeating the charging and discharging of the loop filter. Thereby, the PLL circuit can reach a locked state quickly (or in a short time).

Figure 2:
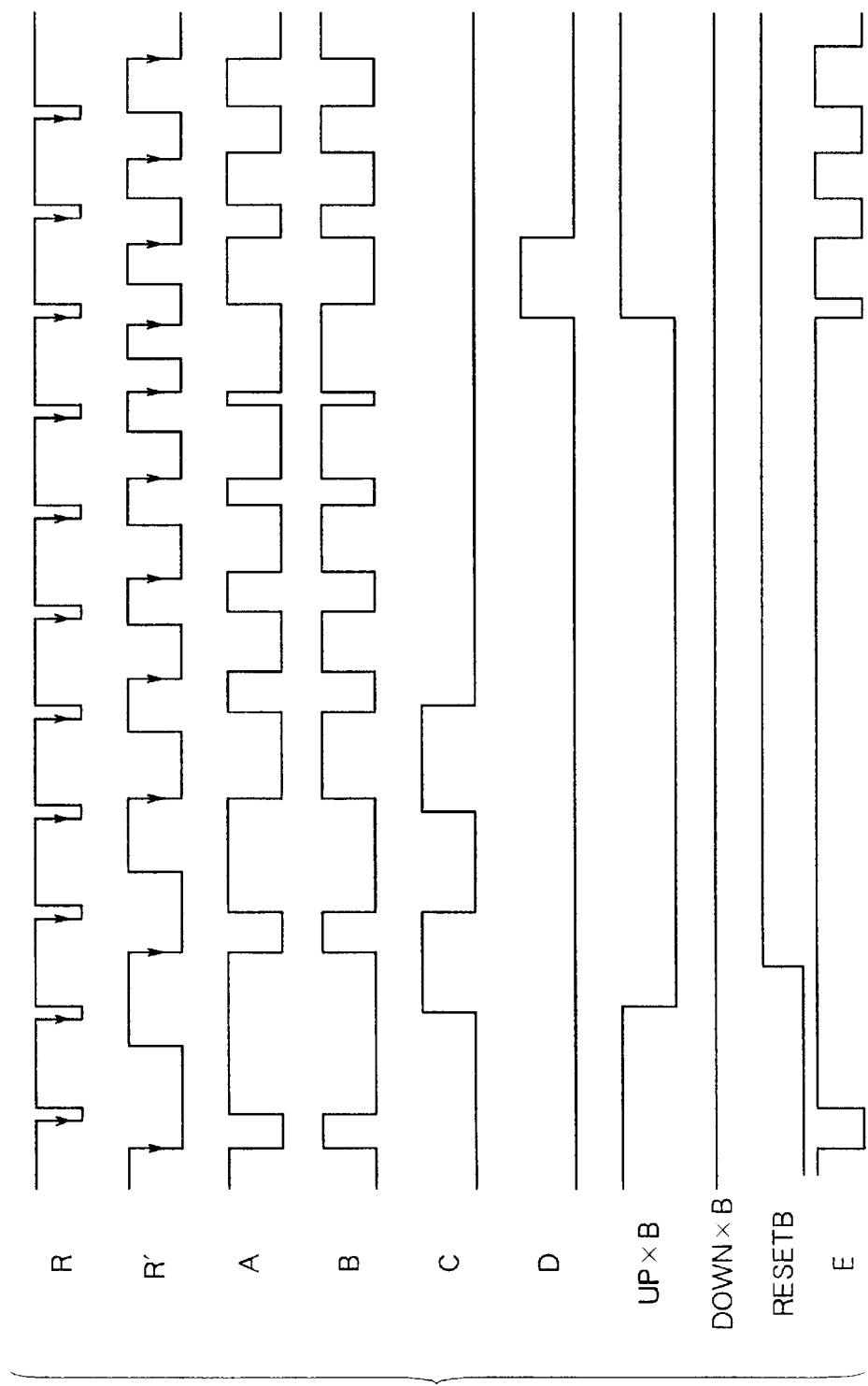
FIG. 2 is a waveform diagram for illustrating an operation of the circuit of FIG. 1.

Next, an operation of the PLL circuit, during which the frequency of the output signal R' of the VCO 40 of FIG. 2 is made to approach the frequency of the input signal R from a frequency being higher or lower than the frequency of the signal R until the frequency of the signal R' reaches that of the signal R, will be described hereinbelow. Namely, when there are a plurality of trailing (or falling) edges of the input signal R between adjacent trailing edges of the output signal R' of the VCO 40, the signal level of an output signal C of the D-type flip-flop 220 becomes a low ("L") level. Further, when there are a plurality of trailing (or falling) edges of the output signal R' of the VCO 40 between adjacent trailing edges of the input signal R, the signal level of an output signal D of the D-type flip-flop 218 becomes a high ("H") level.

Here, a UPXB signal is a signal for keeping an output signal E at the "H" level so as to raise the frequency of the output signal R' of the VCO 40. Further, a DOWNXB signal is a signal for keeping an output signal E at the "L" level so as to lower the frequency of the output signal R' of the VCO 40. Moreover, a RESETB signal is an ordinary power-on reset signal that causes the PLL circuit to go into a mode, in which the adjusting of the frequency is performed at a high speed, only in the beginning when the power is turned on. Each of these signals is in a significant state during being at the "L" level. When the signal C becomes at the "H" level during the RESETB signal has the "L" level and the DOWNXB signal has the "H" level, the signal level of the UPXB signal becomes the "L" level. However, when the signal level of the signal D becomes the "H" level during the RESETB signal has the "L" level and the DOWNXB signal has the "H" level, the signal level of the UPXB signal returns to the "H" level.

Further, although not shown in FIG. 2, in the case of the operation of changing the frequency of the output signal R' of the VCO 40 to the frequency of the input signal R from a frequency being higher than the frequency of the signal R, the signal level of the DOWNXB signal becomes the "L" level when the signal level of the signal D becomes the "H" level during the RESETB signal has the "L" level and the UPXB signal has the "H" level. Further, in such a case, the signal level of the DOWNXB signal returns to the "H" level when the signal level of the signal C becomes the "H" level during the RESETB signal has the "L" level and the UPXB signal has the "H" level.

When the UPXB signal is at the "L" level, the signal level of the output signal E becomes the "H" level. Thus, the signal, which causes an increase in frequency of the output signal R' of the VCO 40, is kept outputted until the frequency of the output signal R' of the VCO 40 becomes higher than that of the input signal R. Consequently, a time required to adjust the frequency of the output signal R' of the VCO 40 is reduced.

Conversely, in the case that the operation of changing the frequency of the output signal R' of the VCO 40 to the frequency of the input signal R is started from a frequency being higher than the frequency of the signal R (not shown in FIG. 2), the signal level of the DOWNXB signal becomes the "L" level. In the meantime, the signal level of the output signal E is the "L" level, so that the circuit operates in such a way as to lower or decrease the frequency of the VCO 40. Consequently, the time required to adjust the frequency of the output signal R' of the VCO 40 is decreased similarly.

Further, if the signal level of each of the RESETB signal and the UPXB signal becomes the "H" level when the circuit is in a state in which the frequency of the output signal of the VCO is nearly equal to that of the input signal, the signal level of an output signal F of the NAND gate 226 becomes the "L" level. Thereafter, this results in suspension of the functions of the circuit for adjusting the frequency of the output signal of the VCO in a short time, which includes the D-type flip-flops 218 and 220, the NAND gates 222, 224 and 228 to 250, the inverter 252 and the NOR gate 254. Subsequently, the operation of adjusting the phase of the output signal of the VCO is performed only by a conventional circuit including the NAND gates 202 to 216. Namely, a signal A becomes the output signal E of the phase comparator 20a.

Embodiment 2

In the case of a non-contact IC card using the PLL circuit of the embodiment described. hereinabove, if a signal having a waveform modulated by BPSK (Binary Phase Shift Keying) is inputted during the operation of adjusting the frequency of the output signal of the VCO, the waveform of the input signal R is distorted when a modulation is performed. Thus, the number of input pluses is increased or decreased by one. It is, thus, suspected that the signal C or D is generated and that the high-speed adjustment of the frequency of the VCO becomes inaccurate.

However, in the case of the input signal which are mostly non-modulated waves and are partly modulated waves, the PLL circuit can enter the high-speed adjusting mode again by continuing the adjusting operation during a predetermined period of time even after the completion of the adjusting of the frequency.

Figure 3:
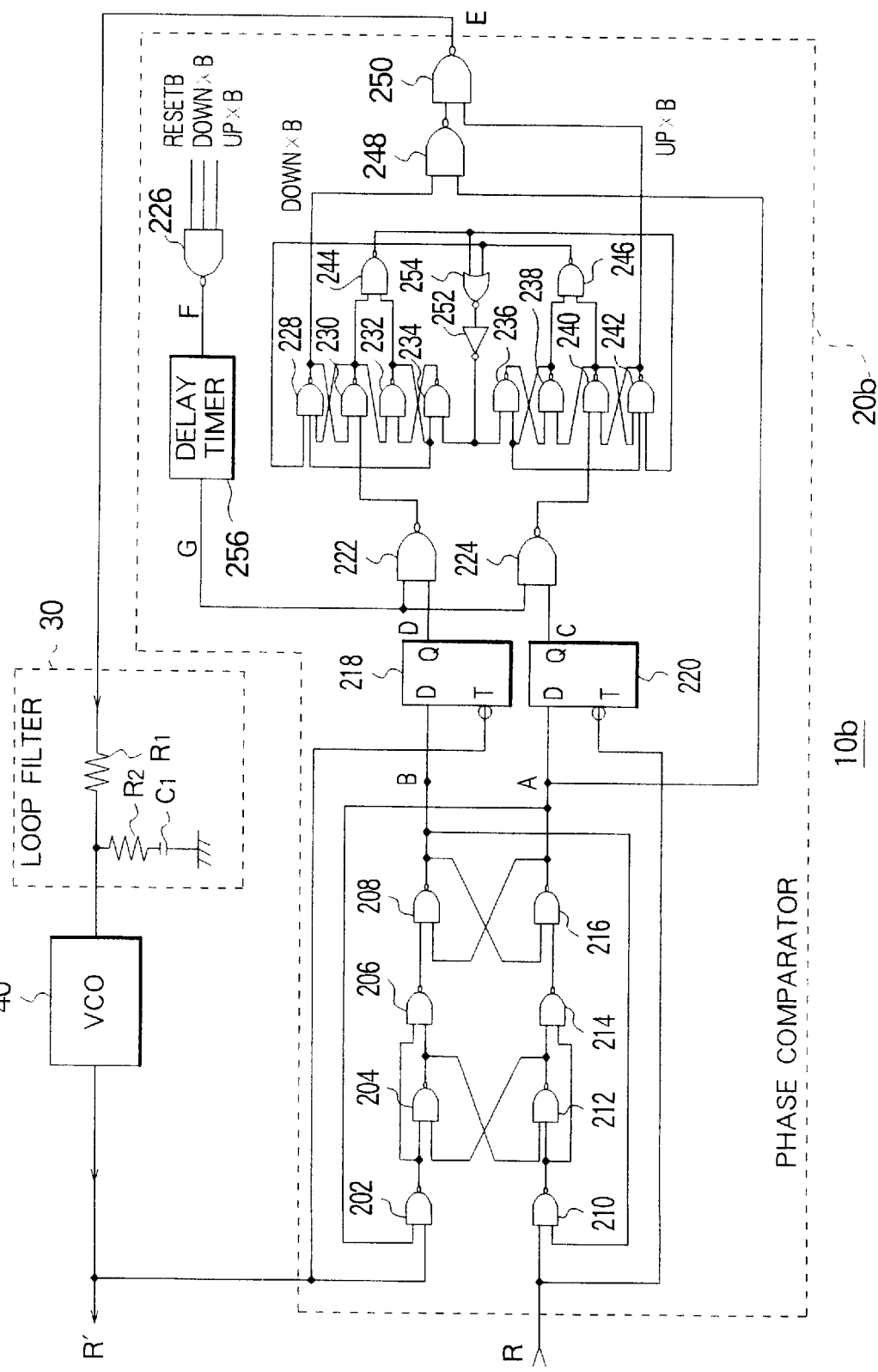
FIG. 3 is a diagram for illustrating the configuration of another PLL embodying the present invention.

FIG. 3 illustrates the configuration of a PLL circuit 10b of this embodiment. In the case of a phase comparator 20b of this PLL circuit 10b, a delay timer (or delaying timer) 256 is provided at the output side of the NAND gate 226. As a result of providing this delay timer 256, in a state in which the frequency of the output signal of the VCO is nearly equal to that of the input signal, the signal levels of the RESETB signal, the DOWNXB signal and the UPXB signal become the "H" level. Thus, even when the signal level of the output signal F of the NAND gate 226 becomes the "L" level, a signal G, by which the signal levels of signals inputted to the NAND gates 222 and 224 are maintained at the "H" level, is outputted for a predetermined period of time set by using the timer 256.

Thereby, even after the signal level of the signal F becomes the "L" level, the PLL circuit can start the frequency adjusting operation again in response to the signal C or D until the signal level of the signal G becomes the "L" level. Consequently, the frequency adjusting operation can be achieved accurately.

Embodiment 3

Figure 4:
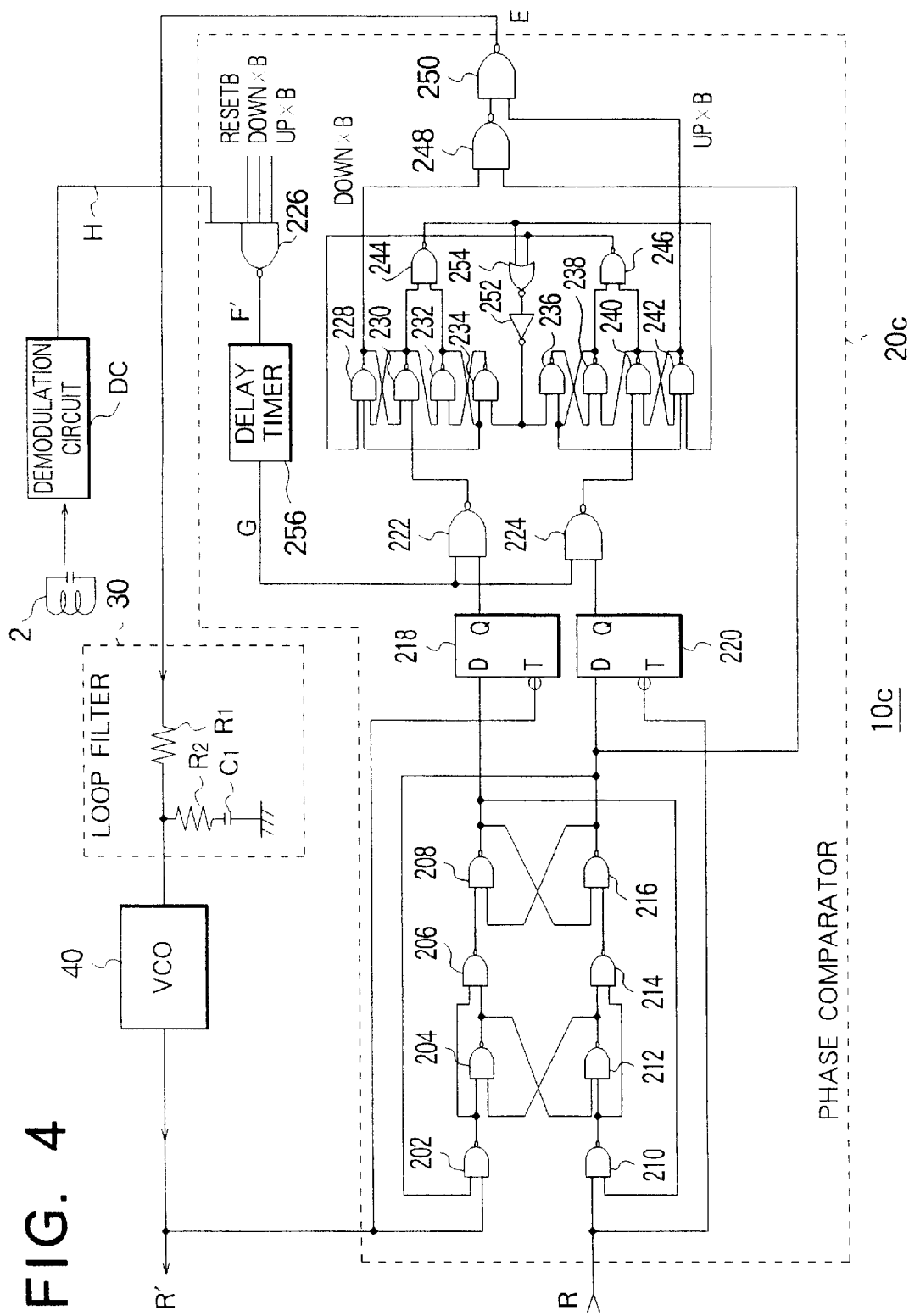
FIG. 4 is a diagram for illustrating the configuration of a further PLL embodying the present invention.

FIG. 4 illustrates the configuration of a PLL circuit 10c of third embodiment of the present invention. When the PLL circuit is not in a locked state, the modulation circuit of the card usually judges that the input circuit is modulated. Thus, in the case of this embodiment, a modulation detecting signal H, which is sent from a demodulation circuit DC of the card and changes the signal level thereof into the "L" level when a modulation is performed on an input signal to the card, namely, when a received signal, is added as an input to the NAND gate 226 of a phase comparator 20c, and is also used to judge whether or not the PLL circuit is locked. Thereby, it can be judged more accurately whether or not the PLL circuit is in a locked state.

Embodiment 4

Figure 5:
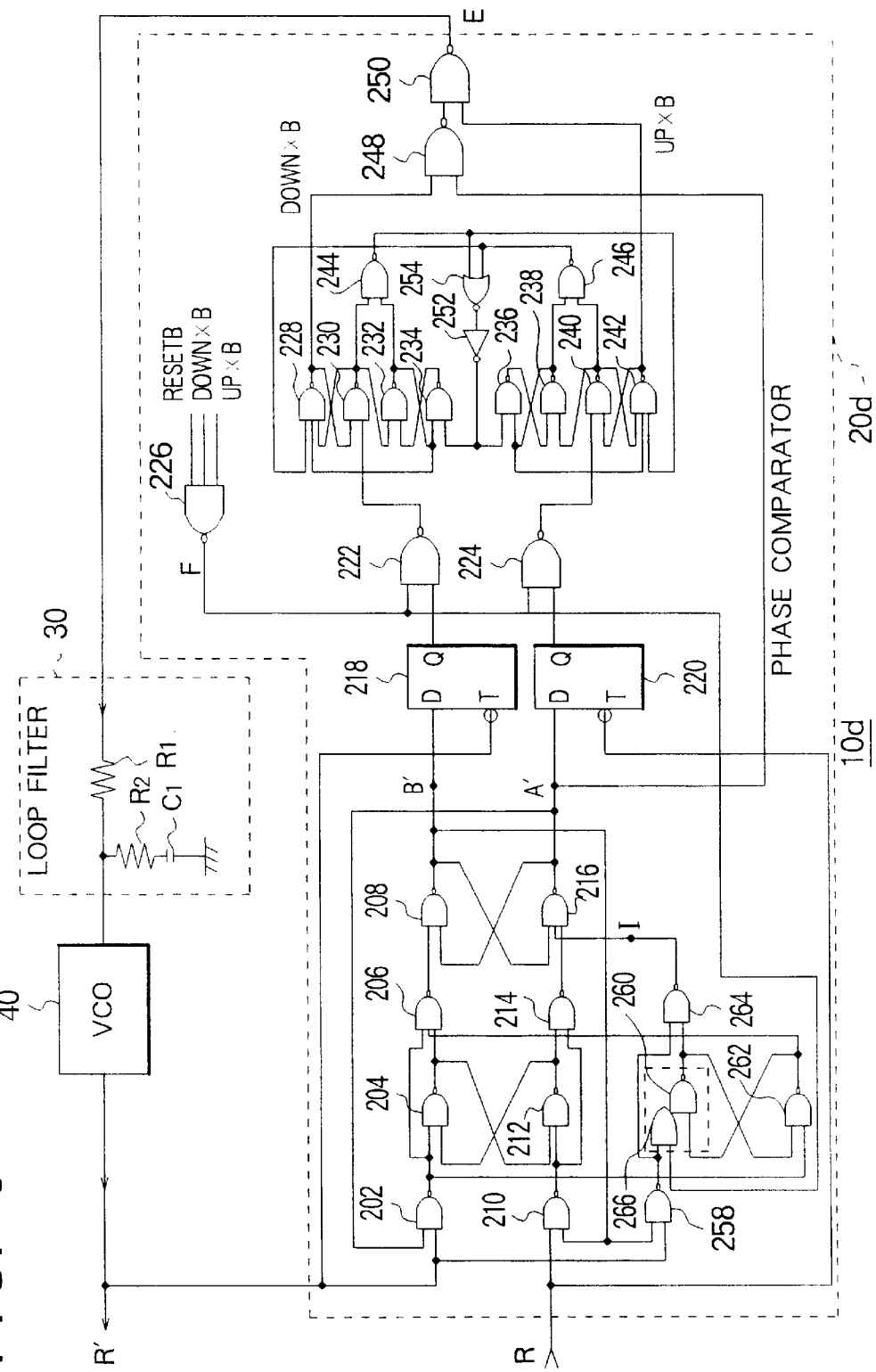
FIG. 5 is a diagram for illustrating the configuration of still another PLL embodying the present invention.
Figure 6:
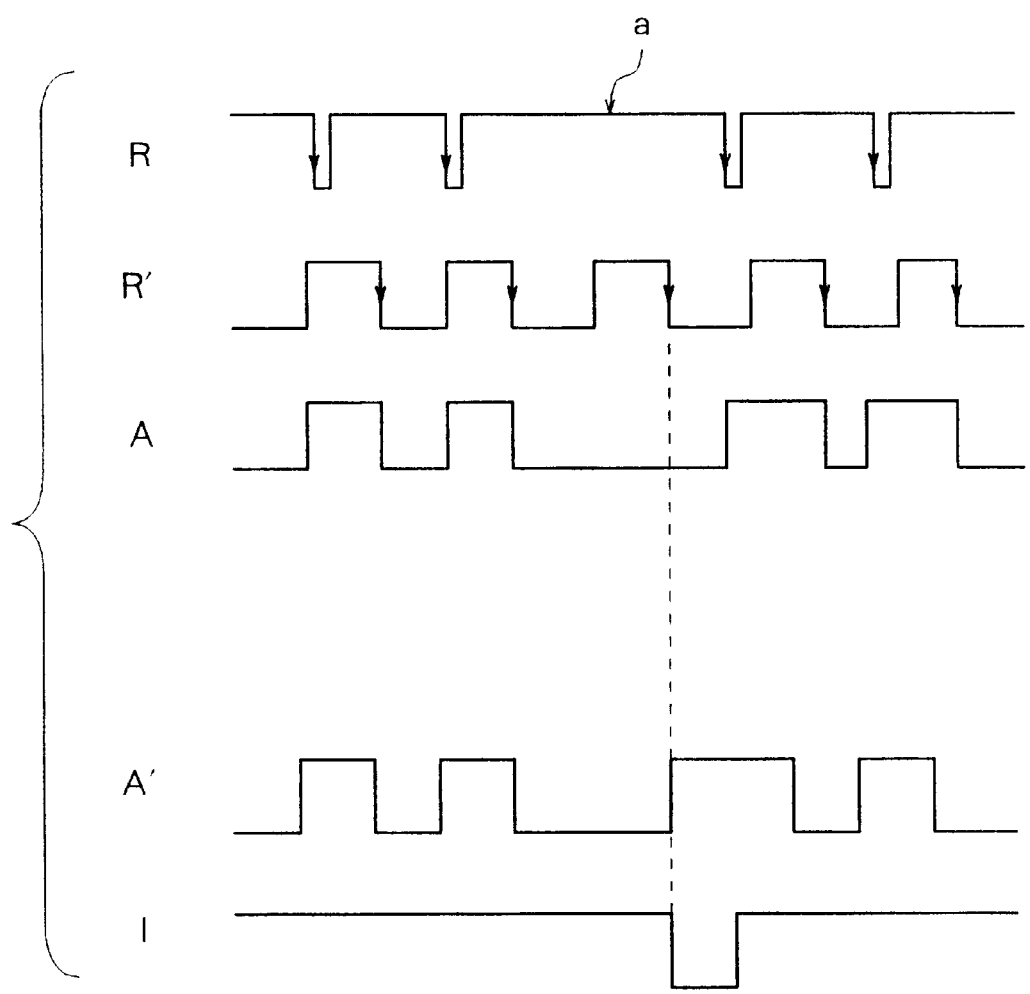
FIG. 6 is a waveform diagram for illustrating an operation of the circuit of FIG. 5.

In the case of fourth embodiment of the present invention, there is provided a phase comparator by which the stability of a PLL circuit upon receiving a modulated wave after locked can be enhanced. FIG. 5 shows the configuration of a PLL circuit 10d of this embodiment. Further, FIG. 6 is a waveform diagram for illustrating the differences in operation between this PLL circuit and the conventional circuit. In the case of a phase comparator 20d of FIG. 5, a portion including NAND gates 258 to 264 and an OR gate 266 is added to the circuit for adjusting the phase, which is shown in the left-side part of this figure.

In the case that the input signal R is modulated as indicated by reference character "a" in FIG. 6 and that after a trailing edge of the output signal R' of the VCO 40 is inputted to the circuit, another trailing edge of the output signal R' is inputted thereto once more, the signal level of the signal A in the case of the conventional circuit remains the "L" level until the next trailing edge of the input signal R is inputted, as illustrated in FIG. 6. Thus, in the case of the conventional circuit, after passing through the loop filter 30, such a signal has a profound effect on the voltage. Moreover, a variation in frequency of an output of the VCO 40 is increased. Consequently, the VCO takes time to recover to the former frequency thereof.

Thus, in the case of this embodiment, if a trailing edge of the output signal R' of the VCO 40 is inputted to the circuit once again after a trailing edge of the output signal R' is inputted thereto, the signal level of a signal A' is forced to recover to the "H" level at that point of time in response to an output signal I (see FIG. 6) of the NAND gate 264.

Thus, a change in duty ratio of the signal A' of this embodiment is small in comparison with the signal A in the case of the conventional circuit, so that the signal A' has a small effect on the voltage after passing through the loop filter 30. Consequently, the variation in frequency of the VCO 40 can be reduced to a small level.

Embodiment 5

Generally, when the oscillation frequency is considerably changed in a PLL circuit with intention of changing the field of use (or application), there is the necessity of simultaneously changing the (circuit) constant of a loop filter. Therefore, it has been difficult to make a conventional loop filter as an IC, owing to the presence of a capacitor C and a resistor R. Thus, hitherto, an external loop filter has been used. In contrast, in the case of this embodiment, a PLL circuit including a loop filter can be totally made as an IC. Moreover, a loop filter, which is adapted to change the (circuit) constant of a loop filter according to the oscillation frequency of a VCO, can be provided.

Figure 7:
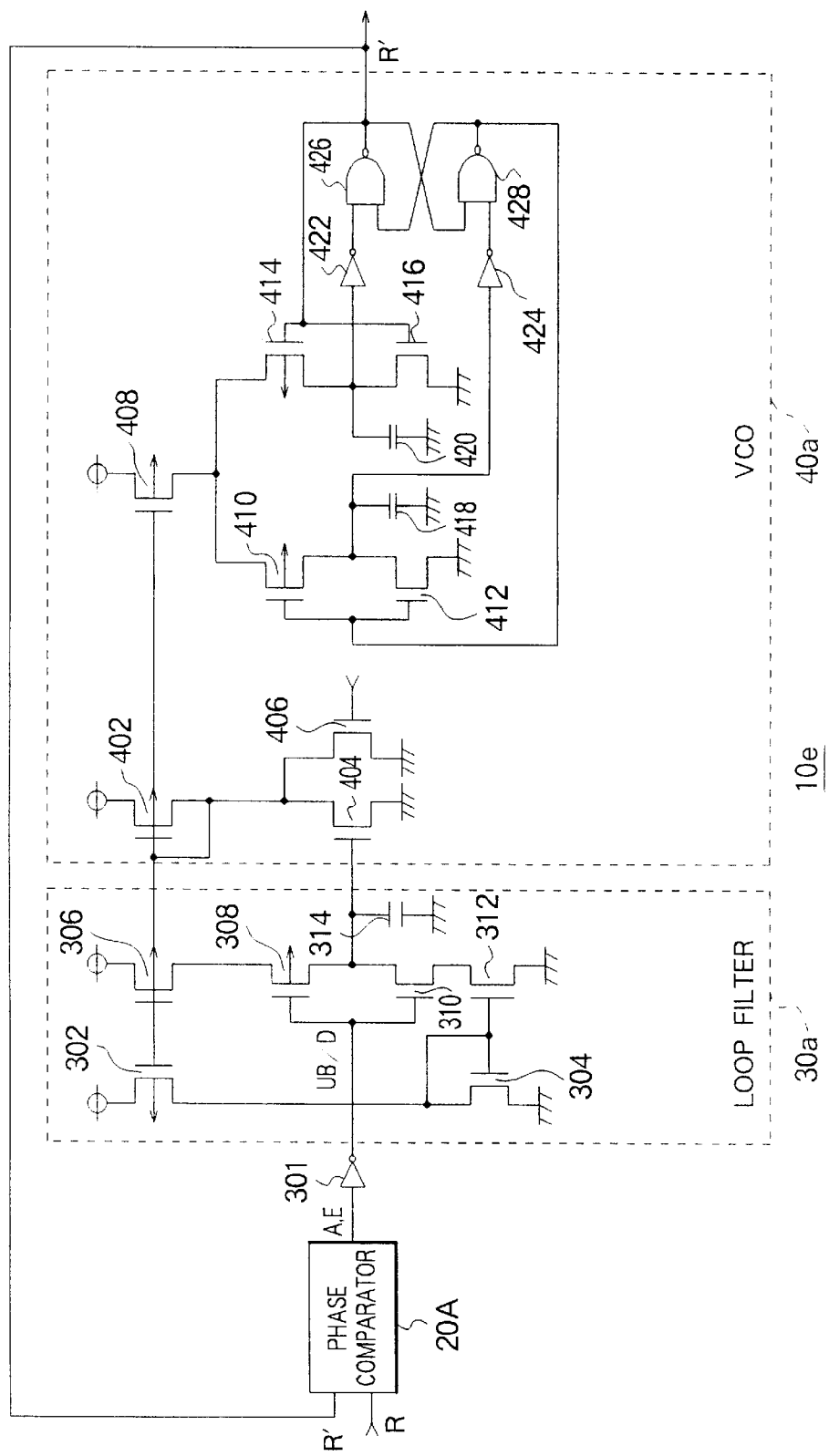
FIG. 7 is a diagram for illustrating the configuration of another PLL embodying the present invention.

FIG. 7 illustrates the configuration of a PLL circuit 10e of this embodiment. Incidentally, any of the phase comparators of the conventional PLL circuit and the PLL circuits of the aforementioned embodiments may be used as a phase comparator 20A. Further, a loop filter 30a includes P-channel transistors 302, 306 and 308, N-channel transistors 304, 310 and 312 and a capacitor 314. Moreover, an inverter 301 is provided in order to invert (or reverse) an output signal A or E of the phase comparator 20A on the grounds of a design of the loop filter 30a so as to obtain a UB/D signal for charging and discharging a capacitor 314 of the loop filter 30a.

Furthermore, a VCO 40 is composed of P-channel transistors 402, 408, 410 and 414, N-channel transistors 404, 406, 412 and 416, capacitors 418 and 420, inverters 422 and 424 and NAND gates 426 and 428. The VCO 40a oscillates as a result of alternately charging the capacitors 418 and 420. The oscillation frequency of the VCO 40a is determined by a quantity of electric current flowing through the P-channel transistor 408.

Hitherto, the circuit constant of the loop filter has been altered by changing the resistance of the resistor R and the capacitance of the capacitor C. However, the changing of the resistance of the resistor and the capacitance of the capacitor is equivalent to the altering of the charging/discharging current. This embodiment is thus adapted so that the circuit constant of the loop filter 30 is changed according to the oscillation frequency of the VCO 40a by charging and discharging the capacitor 314 of the loop filter 30a by the use of an electric current corresponding to the electric current used for determining the oscillation frequency of the VCO 40a in accordance with the output A or E of the phase comparator 20A.

In the case of the circuit of FIG. 7, an electric current flowing through the P-channel transistor 408 of the VCO 40a corresponds to the oscillation frequency of the VCO 40a. Further, another electric current corresponding to such an electric current flowing through this P-channel transistor is fed through the P-channel transistors 302 and 306 of the loop filter 30a. Moreover, the capacitor 314 is charged through the path from the power supply to the P-channel transistor 308 by way of the P-channel transistor 306. Furthermore, the capacitor 314 is discharged through the path from the N-channel transistor 310 to the ground by way of the N-channel transistor 312. Additionally, whether to charge or discharge the capacitor is determined by the switching between the "H" level and the "L" level of the UB/D signal sent from the phase comparator 20A.

Further, the charging current used at the time of charging is made by the aforesaid P-channel transistor 306 to correspond to the oscillation frequency of the VCO 40a. Moreover, the discharging current used at the time of discharging is made by a current mirror circuit, which includes the aforesaid P-channel transistor 302 and the N-channel transistors 304 and 312, to correspond to the oscillation frequency of the VCO 40a. Thereby, the loop filter 30a is adapted so that the (circuit) constant of the loop filter automatically changes according to the frequency of the VCO 40a. Thus, even when the frequency changes, it is unnecessary to regulate the (circuit) constant of the loop filter. Consequently, the PLL circuit, which includes the loop filter and has a wide range of the oscillation frequency, can be made as an IC.

Embodiment 6

Next, a sixth embodiment of the present invention, which relates to the ratio of the resistance of the resistor R1 to that of the resistor R2, will be described hereinbelow, while Embodiment 5 of FIG. 7 relates to the constant corresponding to the capacitor C1 and the resistor R1 of the loop filter of FIG. 1. This Embodiment 6 relates to a damping factor and is adapted to directly change the electric current, which is used for determining the oscillation frequency of the VCO 40b, according to the output A or E (corresponding to the UB/D) of the phase comparator when the input signal R undergoes a modulation similarly as, for example, the part "a" of the signal R of FIG. 6. Thereby, this embodiment can stably operates even when a modulation is performed on the input signal R and the phase thereof changes.

Figure 8:
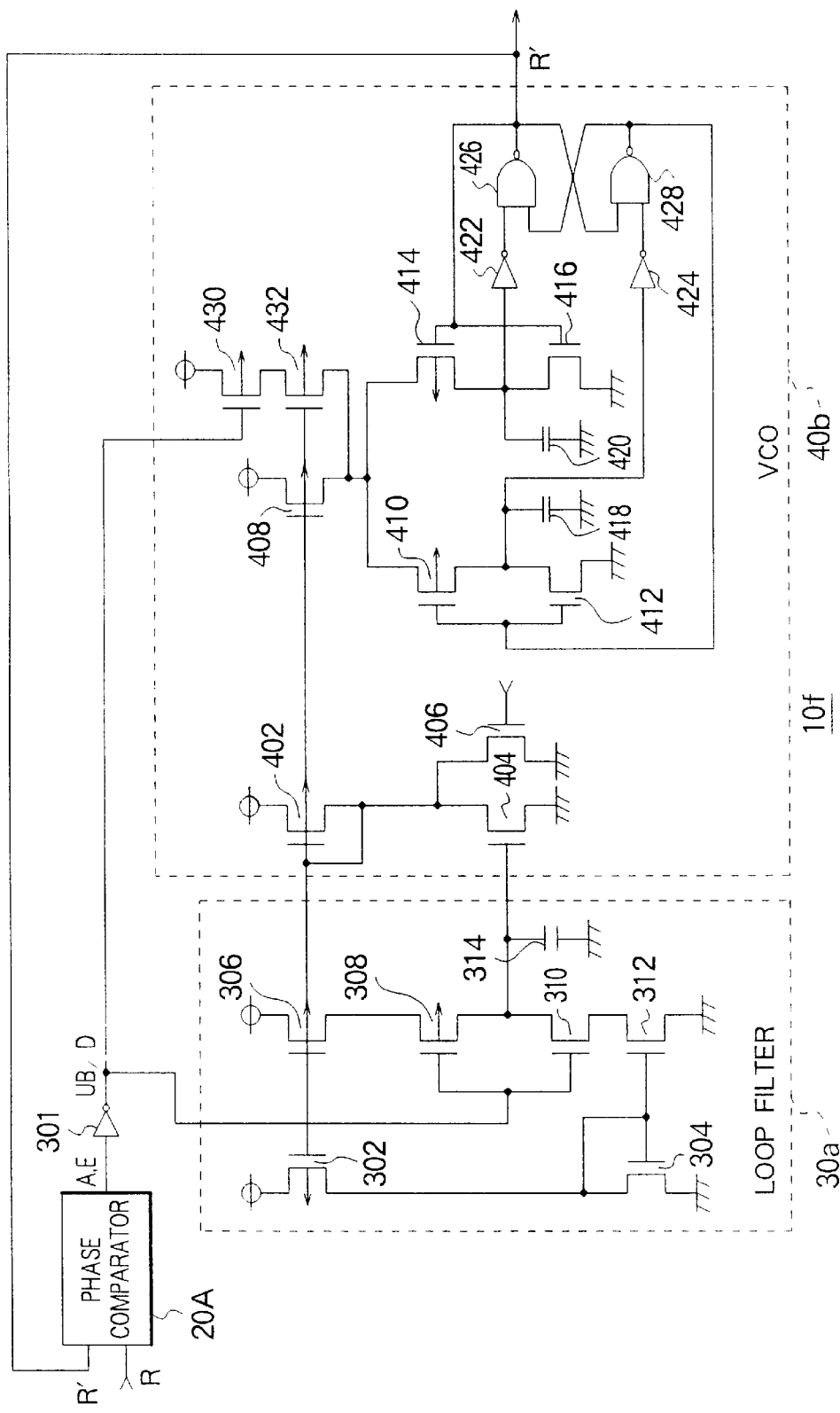
FIG. 8 is a diagram for illustrating the configuration of a further PLL embodying the present invention.

FIG. 8 illustrates the configuration of a PLL circuit 10f of this embodiment. In a VCO 40b, a P-channel transistor 432, through which an electric current flows in such a manner as that the ratio of this electric current to another electric current flowing through a P-channel transistor 408, is provided in parallel with the P-channel transistor 408. Moreover, a P-channel transistor 430, which is operative to directly turn on/off the P-channel transistor 432 in response to the output signal UB/D of the phase comparator 20A, is provided in the VCO 40b.

Further, this PLL circuit is adapted so that the electric current, which is used for determining the oscillation frequency of the VCO 40b, is directly changed by directly turning on or off the P-channel transistor 432 according to the output signal UB/D of the phase comparator 20A by means of the P-channel transistor 430. This ratio between the currents respectively flowing through the P-channel transistors 408 and 432 corresponds to the damping factor. Thereby, even when the frequency changes, it is unnecessary to regulate the circuit constant of the loop filter. Moreover, there can be provided a PLL circuit that stably operates in response to a phase-modulated input signal R and has the oscillation frequencies of a wide range.

Embodiment 7

This embodiment is obtained by combining the aforementioned Embodiment 5 and Embodiment 6 with the UPXB signal and the DOWNXB signal of the phase comparator of the aforesaid Embodiment 1 to Embodiment 3. Thus, a time required to put the PLL circuit into a state, in which the frequency thereof is locked, can be reduced.

Figure 9:
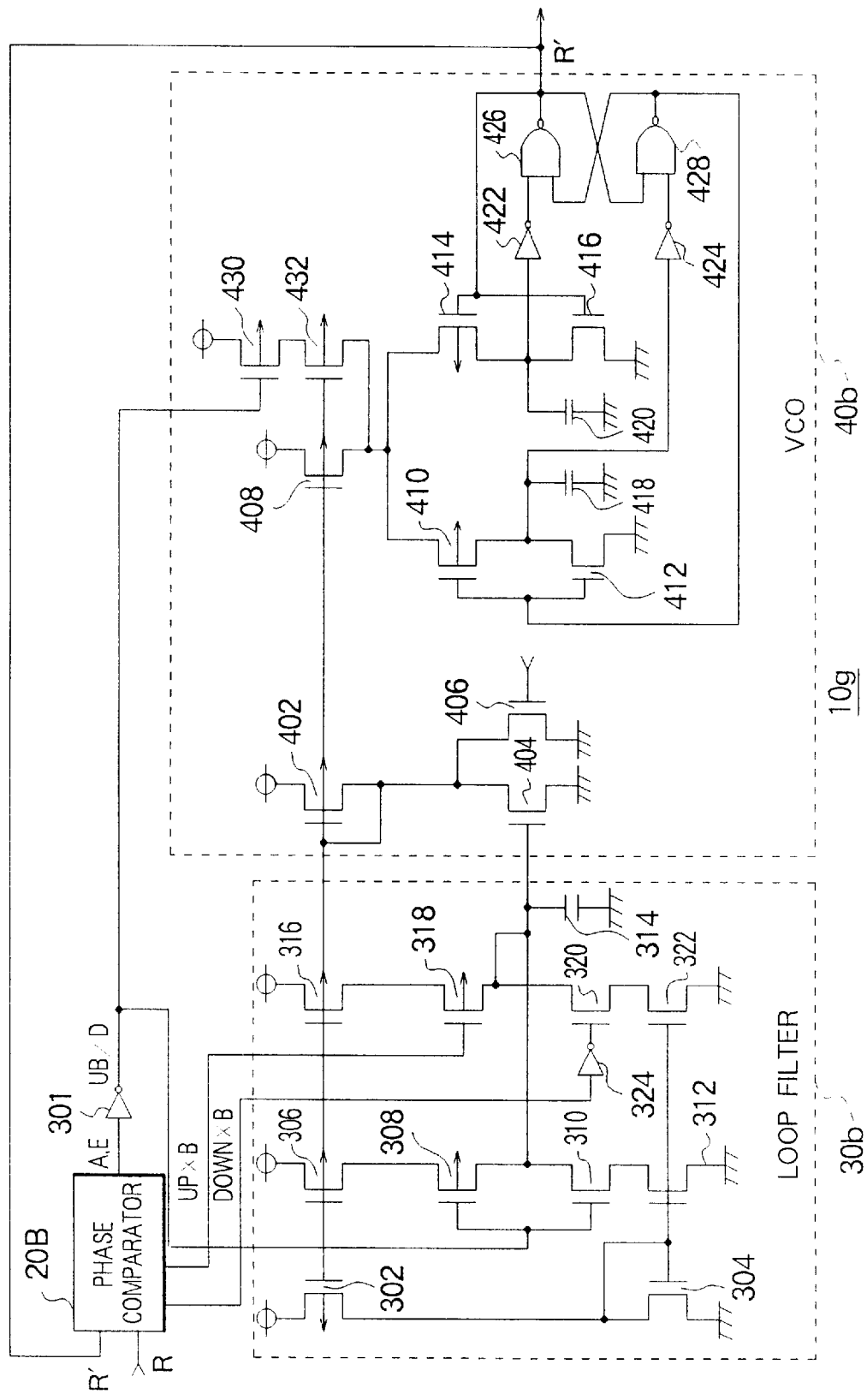
FIG. 9 is a diagram for illustrating the configuration of still another PLL embodying the present invention.

FIG. 9 illustrates the configuration of a PLL circuit 10g of this embodiment. In the case of the PLL circuit of this figure, the phase comparator 20B is the same as of Embodiment 1 to Embodiment 3. Further, a circuit, which includes P-channel transistors 316 and 318, N-channel transistors 320 and 322 and an inverter 324, is added to a loop filter 30b as a circuit for charging and discharging the capacitor 314 according to the UPXB signal and the DOWNXB signal sent from the phase comparator 20B.

Thereby, an electric current to be used for charging and discharging the capacitor 314 of the loop filter 30b can be increased when the UPXB signal and the DOWNXB signal to be used for adjusting the frequency of the VCO are outputted. Thus, there can be obtained a PLL circuit, which does not need regulate the circuit constant of the loop filter even when the frequency changes and which can further reduce a time required to put the PLL into a locked state.

Embodiment 8

Although the output signal UB/D of the phase comparator is used without being changed, the UB/D signal becomes stable at a phase where the electric current used for charging and discharging the capacitor in response to the UB/D signal is balanced. However, there is caused a deviation (or shift) in phase owing to errors occurring in the charging current and the discharging current and to a time lag in the switching between the charging and the discharging of the capacitor.

Thus, in the case of this embodiment, especially, the deviation in phase, which is caused in the locked state, is reduced.

Figure 10:
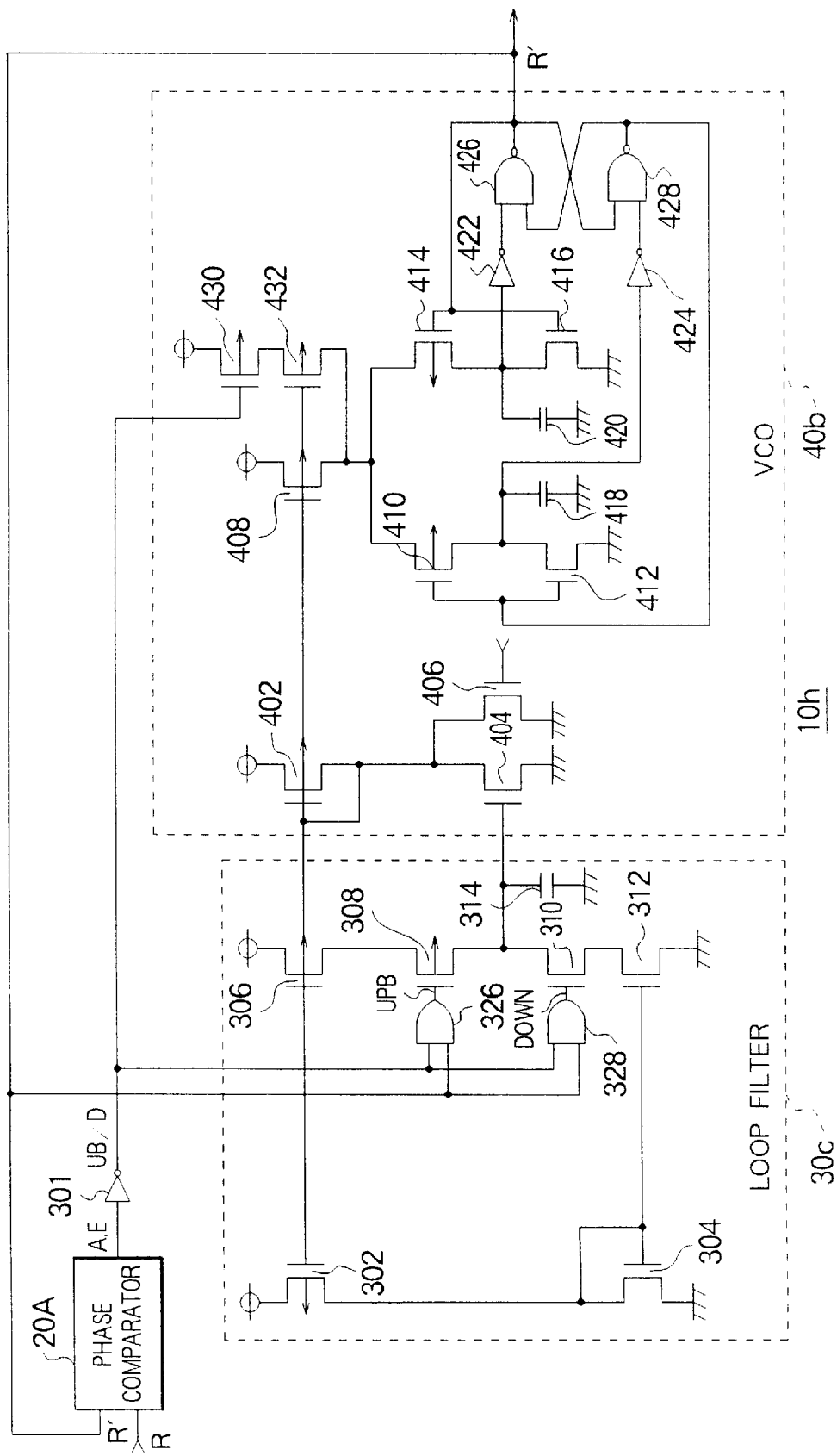
FIG. 10 is a diagram for illustrating the configuration of yet another PLL embodying the present invention.
Figure 11:
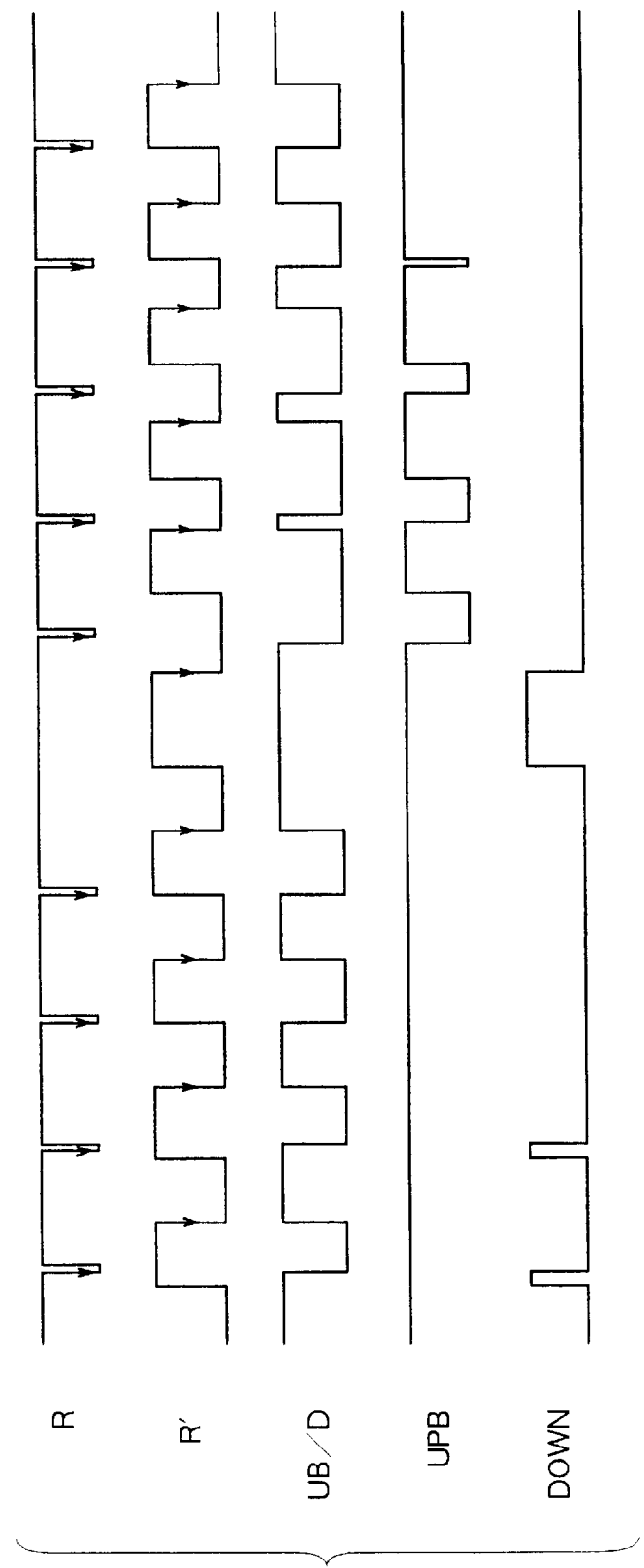
FIG. 11 is a waveform diagram for illustrating an operation of the circuit of FIG. 10.

FIG. 10 illustrates the configuration of a PLL circuit 10h of this embodiment. Further, FIG. 11 illustrates the waveform of a signal flowing through each of parts of the circuit of FIG. 10. In a loop filter 30c, an output signal UPB of an OR gate 326, to which the output signal R' of the VCO 40b and the output signal UB/D of the phase comparator 20A are inputted, is connected to a gate of the P-channel transistor 308 which is at the side of charging the capacitor 314. Further, an output signal DOWN of an AND gate 328, to which the output signal R' of the VCO 40b and the output signal UB/D of the phase comparator 20A are inputted, is connected to a gate of the N-channel transistor 310 which is at the side of discharging the capacitor 314.

Thereby, the charging and the discharging of the capacitor are performed according to the output signal UPB of the OR gate 326, which is used for raising the frequency of the VCO 40b, and to the output signal DOWN of the AND gate 328, which is used for lowering the frequency of the VCO 40b, on the basis of the deviation in shift between the output signal R' of the VCO 40b and the output signal UB/D of the phase comparator 20A.

Thus, the PLL circuit 10h operates in such a way that the time shift between the rise of a pulse of the output signal R' of the VCO 40b and the fall of a corresponding pulse of the output signal UB/D of the phase comparator 20A (namely, the fall of a corresponding pulse of the input signal R) is decreased. Thereby, the deviation in phase, which is caused in the locked state, can be reduced. Consequently, a margin at the time of performing a phase detection can be increased.

Embodiment 9

Generally, it is preferable that a PLL circuit made as a single IC can deal with a wider range of frequencies. Further, it has been well known that a wider range of input frequencies can be obtained for that purpose by providing a frequency divider circuit at the output side of a VCO and by further performing a frequency division on an output of this VCO. Needless to say, it is easy to change the frequency division ratio of the frequency divider circuit by externally setting the circuit. Therefore, such a single IC can deal with a wide range of frequencies. It is, however, necessary to change the circuit constant of the loop filter, which is determined by the capacitance of the capacitor C1 and the resistance of the resistor R1, according to an input frequency.

For example, in the case that the input frequency is specially low, the period of charging and discharging the capacitor of the loop filter becomes long. Moreover, the range of variation in voltage of the capacitor becomes wide, so that the PLL circuit is unstable. Thus, as a method for stabilizing the PLL circuit, the circuit constant of the loop filter is regulated according to the frequency division ratio of the frequency divider circuit by reducing the width (or duration) of each of the output signals UPB and DOWN of the aforementioned Embodiment 8 of FIG. 10 by utilizing input and output signals of the frequency divider circuit (incidentally, if the frequency divider circuit includes a plurality of stages, signals flowing through the intermediate stages thereof are utilized).

Figure 12:
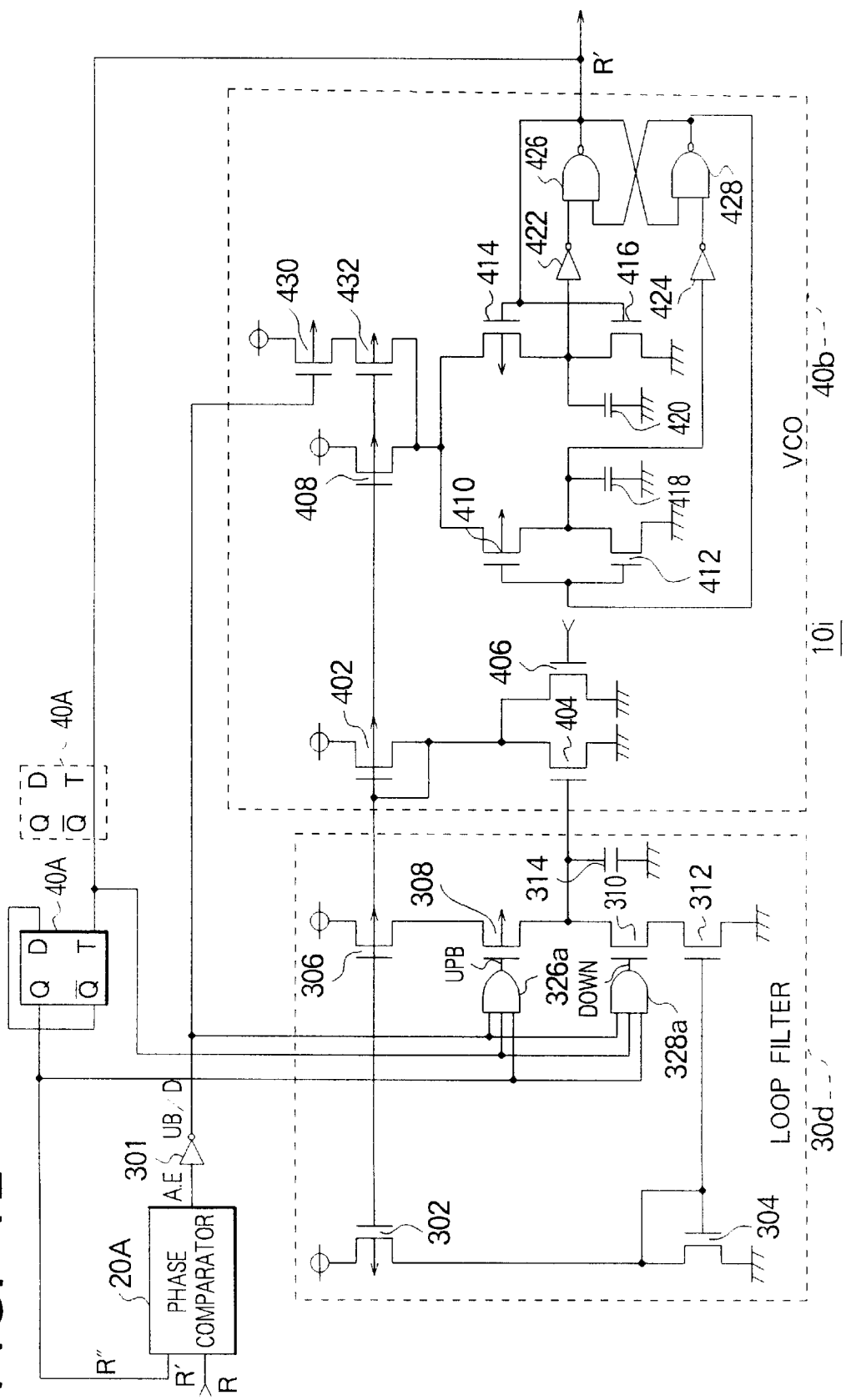
FIG. 12 is a diagram for illustrating the configuration of another PLL embodying the present invention.

FIG. 12 shows the configuration of a PLL circuit 10i of Embodiment 9. In this figure, reference character 40A designates a frequency divider circuit including, for instance, a D-type flip-flop, which is operative to perform what is called a "divide-by-2" operation and is selectively connected to the loop filter according to the frequency of the input signal R. Further, both of signals inputted to and outputted from the frequency divider circuit 40a are inputted to each of an OR gate 326a and an AND gate 328, which respectively correspond to the OR gate 326 and the AND gate 328 of FIG. 10.

Thereby, when the frequency of the input signal R is low and the frequency divider circuit 40A is thus connected to the loop filter, the period of charging and discharging the capacitor does not become long because the width (or duration) of each of the output signals UPB and DOWN is determined by a signal having a short period, which is inputted to the frequency divider circuit 40A. Additionally, in the case that the frequency divider circuit is composed of a plurality of stages of D-type flip-flops, a signal from the D-type flip-flop of an intermediate stage may be inputted to the OR gate 326a and the AND gate 328a.

Figure 13:
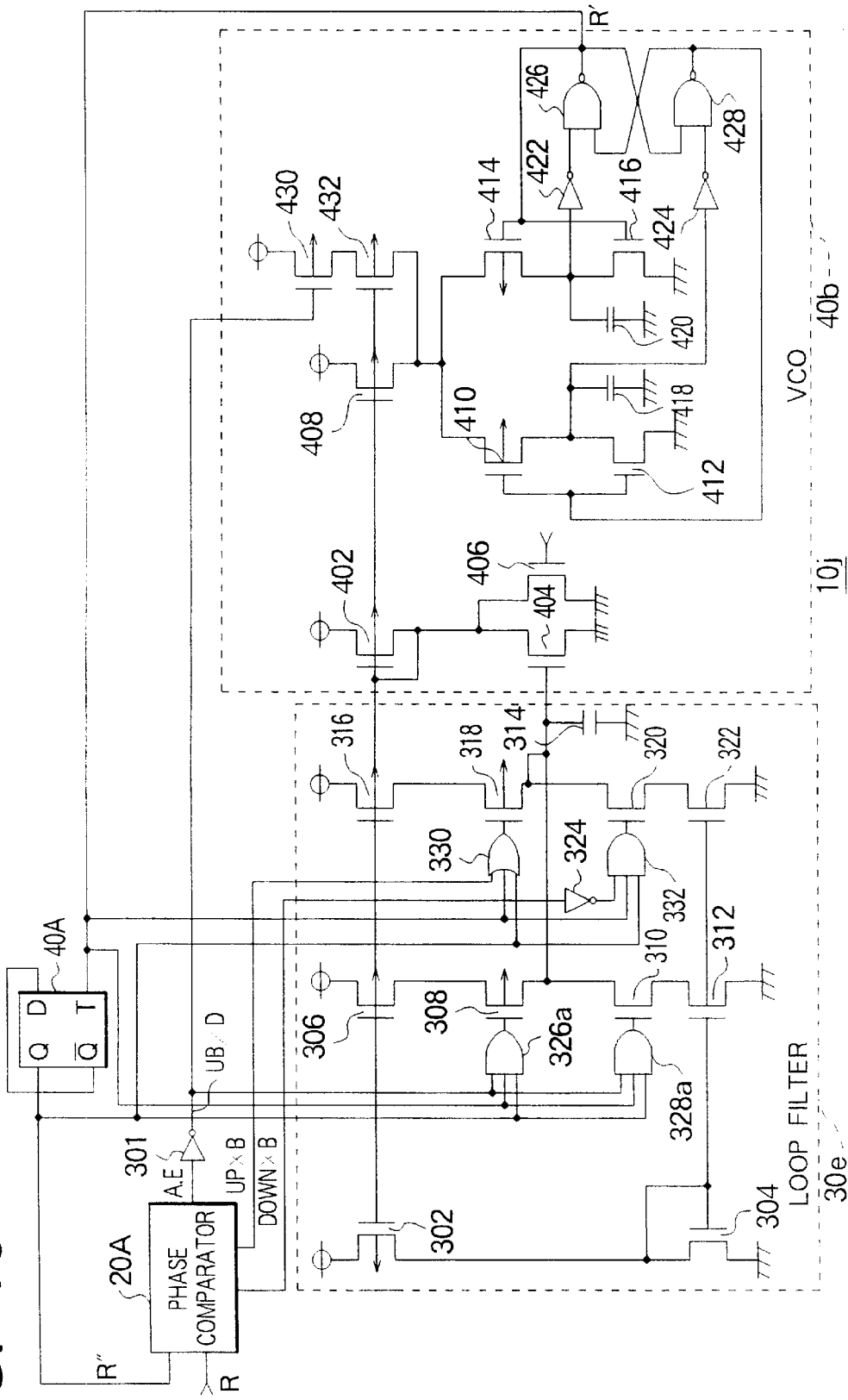
FIG. 13 is a diagram for illustrating the configuration of a further PLL embodying the present invention.

Furthermore, FIG. 13 shows the configuration of another PLL circuit 10j of this embodiment, which is obtained by modifying the PLL circuit of the aforesaid Embodiment 7 of FIG. 9. In this PLL circuit 10j, an OR gate 330, to which the UPXB signal from the phase comparator 20B and signals inputted to and outputted from the frequency divider circuit 40A are inputted, and an AND gate 332, to which the DOWNXB signal inputted from the phase comparator 20B through the inverter 324 and the signals inputted to and outputted from the frequency divider circuit 40A are inputted, are provided in a loop filter 30e.

In the aforementioned manner, the PLL circuit, whose reliability is not degraded even when the range of frequencies is extended, can be obtained by using, for instance, a frequency divider circuit whose frequency division ratio can be regulated.

Embodiment 10

Differently from the aforesaid Embodiment 9 in which the period of charging and discharging the capacitor of the loop filter is reduced in the case that the input frequency is low and thus the frequency divider circuit is used therein, small currents are used as the charging and discharging currents in the case of this embodiment.

Figure 14:
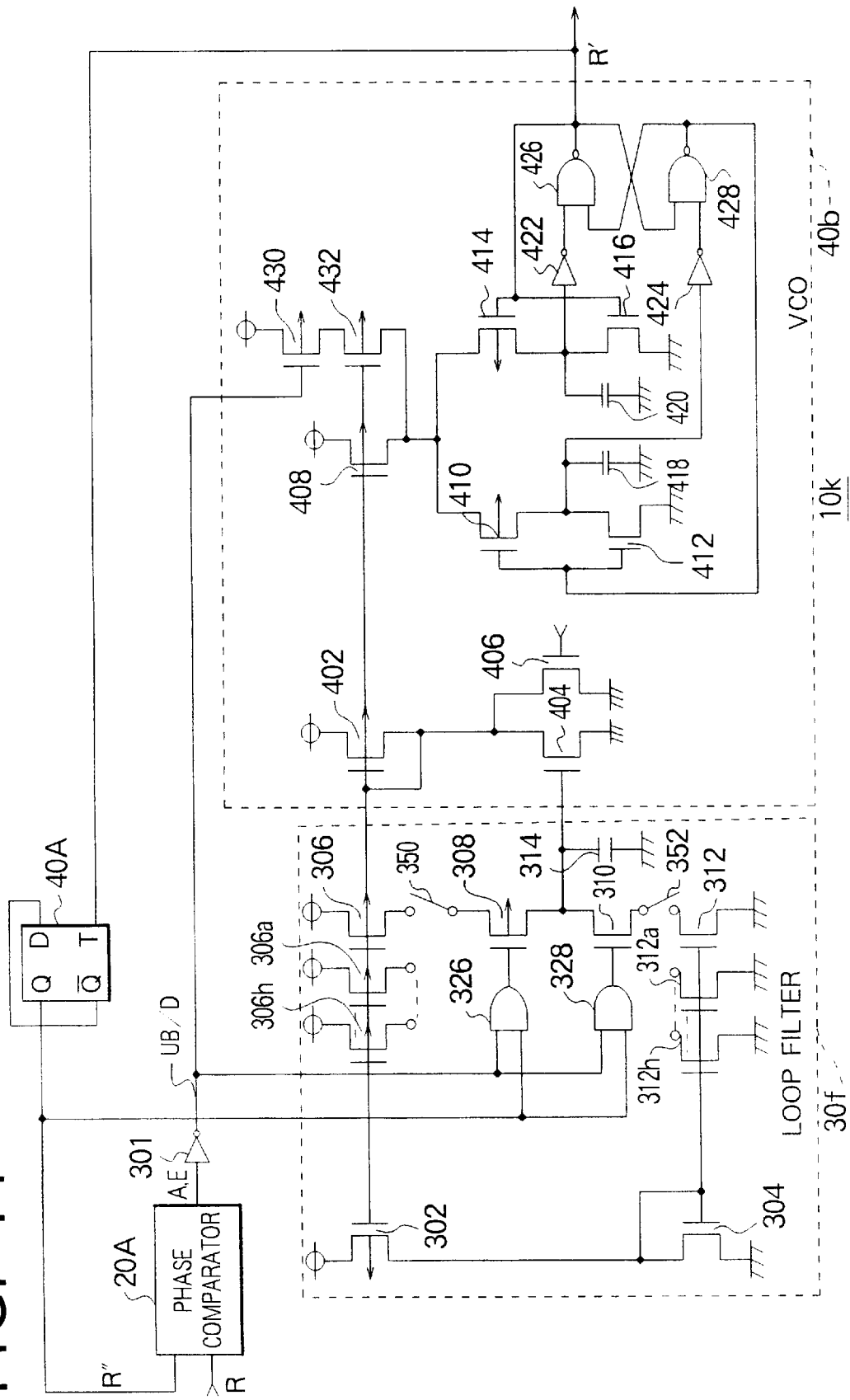
FIG. 14 is a diagram for illustrating the configuration of still another PLL embodying the present invention.
Figure 15:
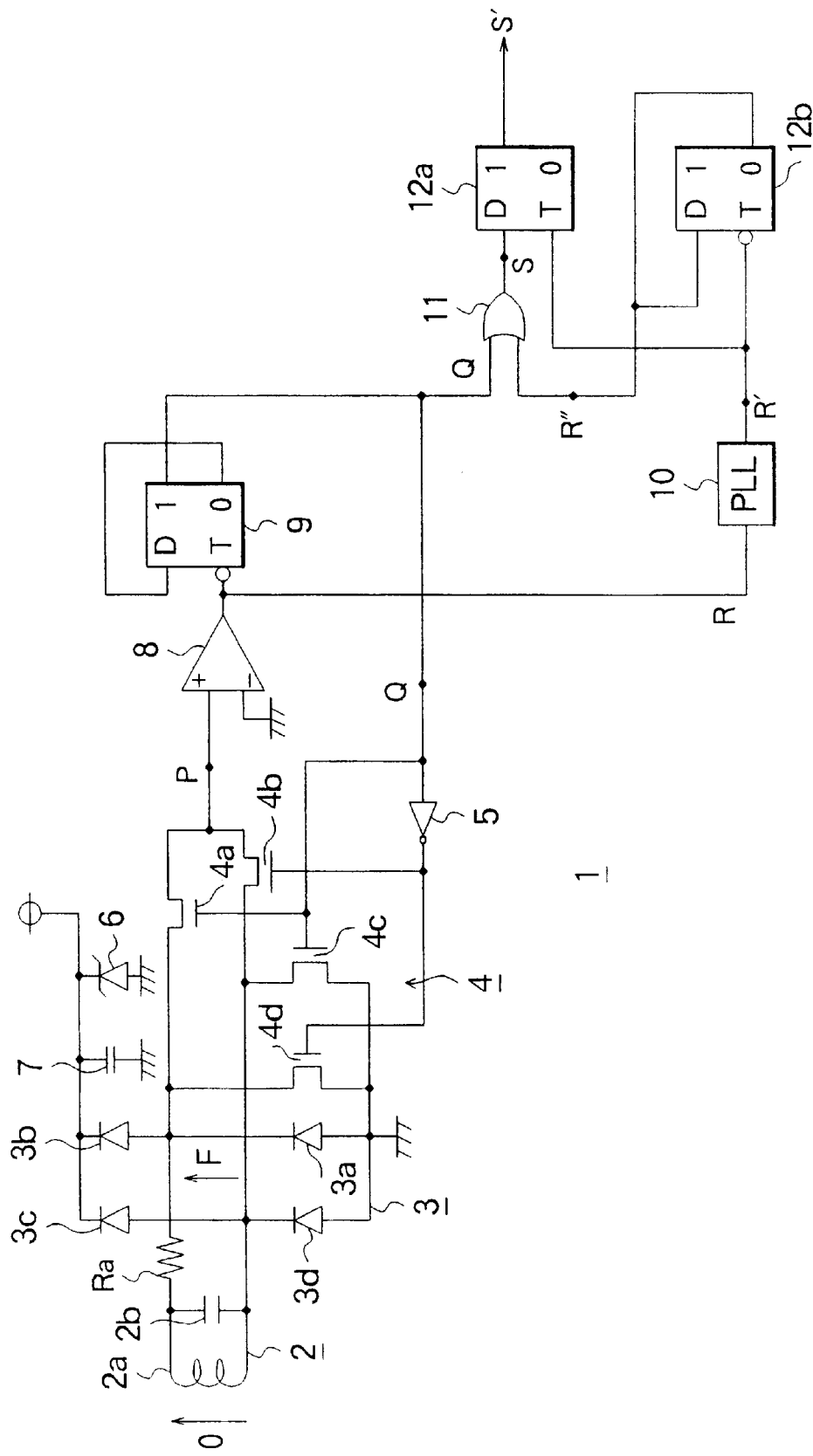
FIG. 15 is a schematic diagram for schematically illustrating the configuration of a receiving circuit, which contains a PLL circuit, of a non-contact IC card.
Figure 16:
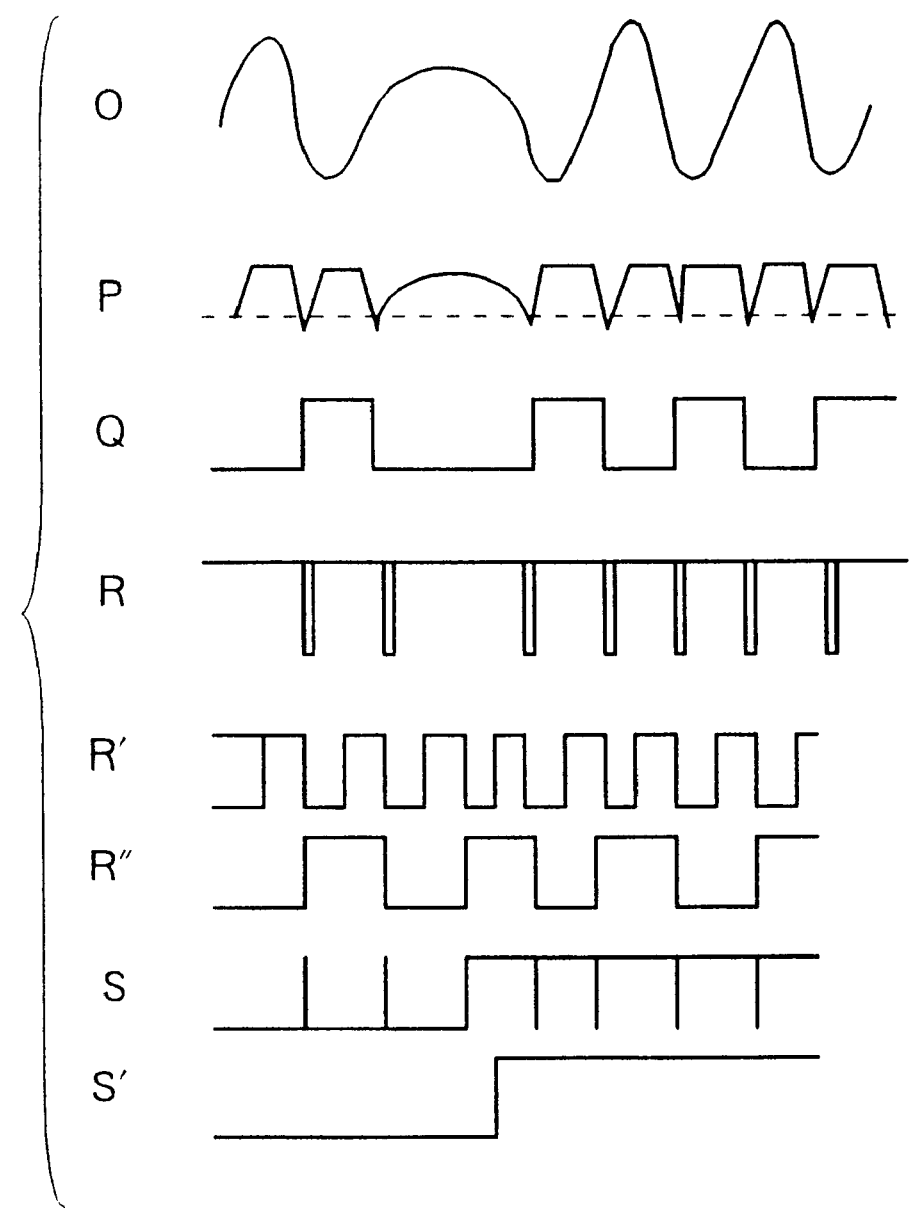
FIG. 16 is a waveform diagram for illustrating an operation of the circuit of FIG. 15.
Figure 17:
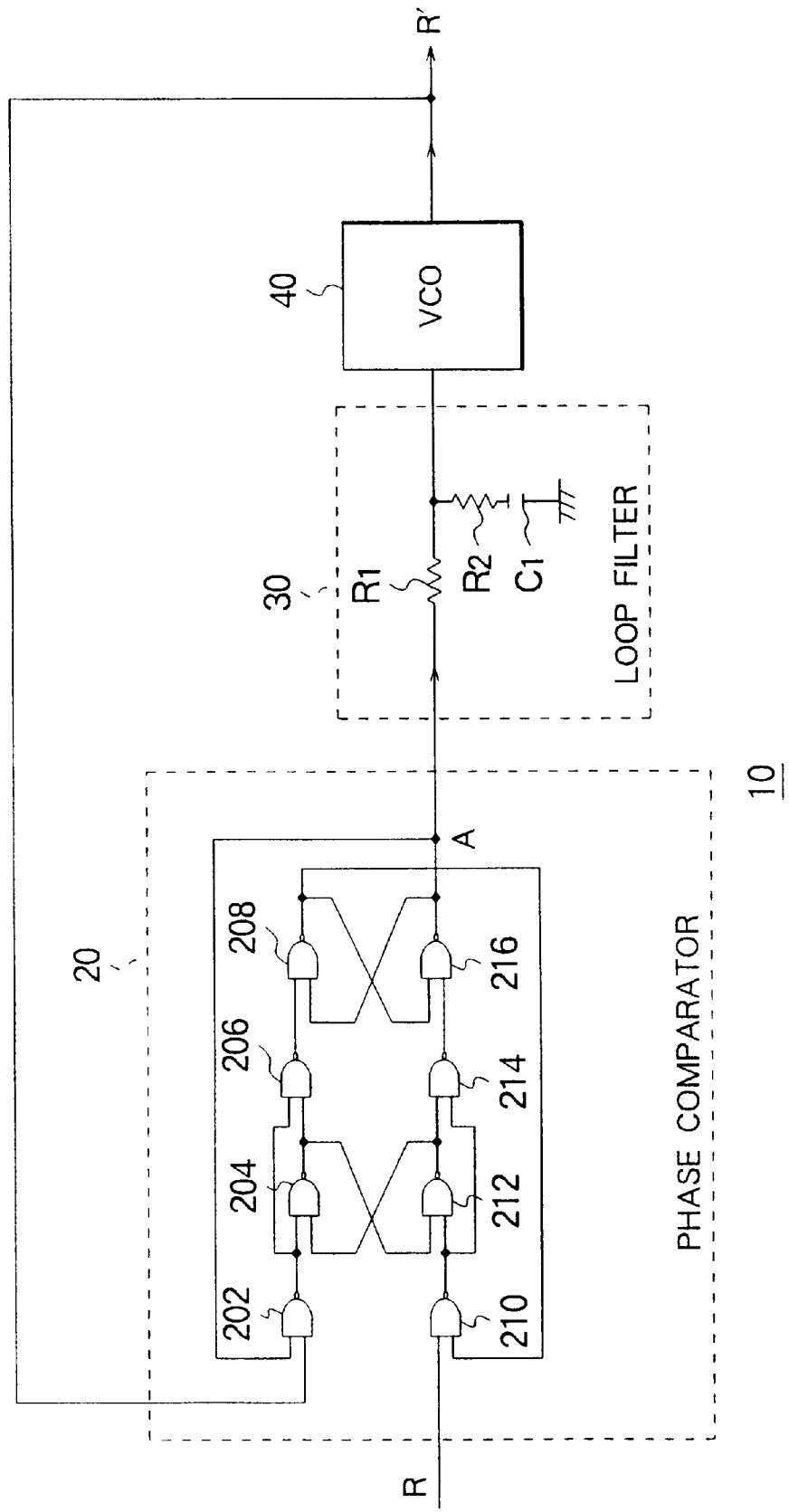
FIG. 17 is a diagram for illustrating the configuration of an example of a conventional PLL circuit.

FIG. 14 illustrates the configuration of a PLL circuit 10k of this embodiment. In the case of this PLL circuit 10k, a plurality of P-channel transistors 306a to 306n, through which different currents flow, respectively, are provided in a loop filter 30f in parallel with the P-channel transistor 306 for the charging. Moreover, similarly, a plurality of N-channel transistors 312a to 312n, through which different currents flow, respectively, are provided in a loop filter 30f in parallel with the N-channel transistor 312 for the discharging. Furthermore, the group of the P-channel transistors 306a to 306n and the group of the N-channel transistors 312a to 312n are connected to the P-channel transistor 308 for the charging and the N-channel transistor 310 for the discharging, respectively, according to the frequency division ratio by being switched by means of switches 350 and 352.

Thereby, the current values of the currents used for charging and discharging the capacitor 314 can be changed according to the frequency division ratio of the frequency divider circuit 40A set in accordance with the frequency of the input signal R. Consequently, there can be obtained a PLL circuit, the reliability of which is not deteriorated even when the range of frequencies is extended.

Incidentally, the present invention is not limited to the aforementioned embodiments. Further, all of the possible combinations of these embodiments fall within the scope of the present invention.

Although the preferred embodiments of the present invention have been described above, it should be understood that the present invention is not limited thereto as above stated and that other modifications will be apparent to those skilled in the art without departing from the spirit of the invention.

The scope of the present invention, therefore, should be determined solely by the appended claims.

What is claimed is:

1. A PLL circuit comprising:

a phase comparator;

a loop filter which is charged and discharged according to an output of said phase comparator; and a voltage controlled oscillator which oscillates according to a voltage output from said loop filter and feeds back an output thereof to said phase comparator, wherein said phase comparator;

charges said loop filter with a constant high voltage level when it is detected during an initial period that an oscillation frequency of said voltage controlled oscillator is lower than a frequency of an input signal, so as to increase the oscillation frequency of said voltage controlled oscillator until it is detected that an oscillation frequency of said voltage controlled oscillator is higher than the frequency of the input signal and discharges said loop filter with a constant low voltage level when it is detected during the initial period that an oscillation frequency of said voltage controlled oscillator is higher than the frequency of the input signal, so as to decrease the oscillation frequency of said voltage controlled oscillator until it is detected that an oscillation frequency of said voltage controlled oscillator is lower than the frequency of the input signal, and adjusts a phase of the output of said voltage controlled oscillator to a phase of the input signal after the oscillator frequency of said voltage controlled oscillator is adjusted to the frequency of the input signal.

2. The PLL circuit according to claim 1, wherein said phase comparator further includes frequency adjustment completion delaying means for delaying completion of frequency adjustment of said voltage controlled oscillator so as to prevent the frequency of said voltage controlled oscillator from being adjusted to an erroneous frequency so that said voltage controlled oscillator is locked to the erroneous frequency.

3. The PLL circuit according to claim 1, wherein said phase comparator further includes signal compensation means for suppressing a variation in duty ratio of the output of said phase comparator even when a phase-modulated signal is input thereto after the frequency of said voltage controlled oscillator is locked.

4. The PLL circuit according to claim 1, wherein said phase comparator includes;

frequency adjusting means for performing the charging and discharging of said loop filter; and phase adjusting means for performing the phase adjustment.

5. The PLL circuit according to claim 4, which is used in a detection circuit for detecting a phase-modulated received signal, wherein when a signal, which indicates that the received signal has been modulated, is input to said frequency adjusting means, and when the reception signal has been modulated, said frequency adjusting means continues to adjust the frequency of said voltage controlled oscillator.

6. A PLL circuit comprising:

a phase comparator;

a loop filter which is charged and discharged according to an output of said phase comparator;

a voltage controlled oscillator that oscillates according to a voltage output from said loop filter and feeds back an output thereof to said phase comparator; and a frequency divider circuit for performing a frequency division on the output of said voltage controlled oscillator which is fed back to said phase comparator, wherein said loop filter includes;
   a capacitor, said capacitor being charged and discharged, based on an electric current corresponding to an electric current used for determining an oscillation frequency of said voltage controlled oscillator, said loop filter having a direct connection with said voltage controlled oscillator to receive a signal representing the frequency of said voltage controlled oscillator, wherein said capacitor is charged and discharged by first charging/discharging means included in said loop filter, and
   charging/discharging current changing means for changing a ratio of a charging/discharging current of said first charging/discharging means thereof to an electric current used to determine an oscillation frequency of said voltage controlled oscillator.

7. The PLL circuit according to claim 6, wherein said loop filter has two direct connections to said voltage controlled oscillator, a first connection for providing the voltage to said voltage controlled oscillator which controls the oscillation of said voltage controlled oscillator, and a second connection for receiving the signal representing the frequency of said voltage controlled oscillator so that the loop filter constant of said loop filter can be adjusted automatically.

8. The PLL circuit according to claim 7, wherein said second direct connection to said voltage controlled oscillator monitors the frequency of said voltage controlled oscillator by determining a quantity of current flowing through a transistor provided within said voltage controlled oscillator.

9. A PLL circuit comprising:

a phase comparator;

a loop filter which is charged and discharged according to an output of said phase comparator; and a voltage controlled oscillator that oscillates according to a voltage output from said loop filter and feeds back an output thereof to said phase comparator, wherein said loop filter is coupled to said voltage controlled oscillator to receive a current signal which represents the oscillation frequency of said voltage controlled oscillator, said loop filter including;
   a capacitor, said capacitor being charged and discharged, based on an electric current corresponding to said current signal which represents the oscillation frequency of said voltage controlled oscillator, wherein said voltage controlled oscillator further includes compensation means for receiving the output of said phase comparator, and for controlling the output of said current signal which represents the oscillation frequency of said voltage controlled oscillator in accordance with the output of said phase comparator to suppress the effects of a variation in duty ratio of the output of said phase comparator even when a phase-modulated signal is input thereto.

10. A PLL circuit, comprising:

a phase comparator;

a loop filter which is charged and discharged according to an output of said phase comparator; and a voltage controlled oscillator that oscillates according to a voltage output from said loop filter and feeds back an output thereof to said phase comparator, wherein said loop filter includes;
   a capacitor, said capacitor being charged and discharged, based on an electric current corresponding to an electric current used for determining an oscillation frequency of said voltage controlled oscillator;

wherein said phase comparator further includes;

frequency adjusting means for charging said loop filter when it is detected that an oscillation frequency of said voltage controlled oscillator is lower than a frequency of an input signal, so as to increase the oscillation frequency of said voltage controlled oscillator until it is detected that an oscillation frequency of said voltage controlled oscillator is higher than the frequency of the input signal, and for discharging the loop filter when it is detected that an oscillation frequency of said voltage controlled oscillator is higher than the frequency of the input signal, so as to decrease the oscillation frequency of said voltage controlled oscillator until it is detected that an oscillation frequency of said voltage controlled oscillator is lower than the frequency of the input signal; and phase adjusting means for adjusting a phase of the output of said voltage controlled oscillator to a phase of the input signal after the oscillator frequency of said voltage controlled oscillator is adjusted to the frequency of the input signal, wherein said loop filter further includes;
   first charging/discharging means for charging/discharging said capacitor, and
   second charging/discharging means for charging and discharging said capacitor according to an output of said frequency adjusting means, thereby increasing a charging/discharging current in said loop filter only when adjusting the oscillation frequency of said voltage controlled oscillator.

11. The PLL circuit according to claim 10, further comprising a frequency divider circuit for performing a frequency division on the output of said voltage controlled oscillator, which is fed back to said phase comparator, wherein said loop filter includes charging/discharging control means for controlling said first charging/discharging means based on both the output of said phase comparator and the output of said voltage controlled oscillator in such a manner that said first charging/discharging means charges and discharges said capacitor at a duty ratio corresponding to a phase difference between the output of said voltage controlled oscillator and the input signal, wherein said charging/discharging control means of said loop filter includes limiting means for limiting a duty factor of a current used to charge and discharge said capacitor according to a frequency division ration of said frequency divider circuit.

12. A PLL circuit, comprising:

a phase comparator;

a loop filter which is charged and discharged according to an output of said phase comparator; and a voltage controlled oscillator that oscillates according to a voltage output from said loop filter and feeds back an output thereof to said phase comparator, wherein said loop filter includes;
- a capacitor, said capacitor being charged and discharged, based on an electric current corresponding to an electric current used for determining an oscillation frequency of said voltage controlled oscillator;

wherein said capacitor is charged and discharged by first charging/discharging means included in said loop filter, and wherein said loop filter includes charging/discharging control means for controlling said first charging/discharging means based on both the output of said phase comparator and the output of said voltage controlled oscillator in such a manner that said first charging/discharging means charges and discharges said capacitor at a duty ratio corresponding to a phase difference between the output of said voltage controlled oscillator and the input signal.

13. The PLL circuit according to claim 12, which further comprises a frequency divider circuit for performing a frequency division on the output of said voltage controlled oscillator, which is fed back to said phase comparator, wherein said charging/discharging control means of said loop filter includes limiting means for limiting a duty factor of a current used to charge and discharge said capacitor according to a frequency division ratio of said frequency divider circuit.

* * * * *